United States Patent
Cha

(10) Patent No.: US 9,735,156 B1
(45) Date of Patent: Aug. 15, 2017

(54) SEMICONDUCTOR DEVICE AND A FABRICATING METHOD THEREOF

(71) Applicant: Ji-Hoon Cha, Seoul (KR)

(72) Inventor: Ji-Hoon Cha, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/006,421

(22) Filed: Jan. 26, 2016

(51) Int. Cl.
| | |
|---|---|
| H01L 29/66 | (2006.01) |
| H01L 27/088 | (2006.01) |
| H01L 29/06 | (2006.01) |
| H01L 29/78 | (2006.01) |
| H01L 29/423 | (2006.01) |
| H01L 27/02 | (2006.01) |

(52) U.S. Cl.
CPC ...... H01L 27/0886 (2013.01); H01L 27/0207 (2013.01); H01L 29/0649 (2013.01); H01L 29/42368 (2013.01); H01L 29/7851 (2013.01)

(58) Field of Classification Search
CPC ............ H01L 27/0886; H01L 29/0649; H01L 29/7851; H01L 29/42368; H01L 27/0207
See application file for complete search history.

(56) References Cited

U.S. PATENT DOCUMENTS

| | | | |
|---|---|---|---|
| 6,107,159 A * | 8/2000 | Chuang ............ | H01L 21/76229 257/E21.548 |
| 8,603,893 B1 | 12/2013 | Wei et al. | |
| 8,658,536 B1 | 2/2014 | Choi et al. | |
| 8,815,742 B2 | 8/2014 | Cai et al. | |
| 8,829,617 B2 | 9/2014 | Haran et al. | |
| 8,835,262 B2 | 9/2014 | Cai et al. | |
| 8,895,446 B2 | 11/2014 | Peng et al. | |
| 8,941,179 B2 | 1/2015 | Bergendahl et al. | |
| 2014/0315371 A1* | 10/2014 | Cai ................. | H01L 21/823821 438/424 |
| 2014/0353795 A1 | 12/2014 | Tong et al. | |
| 2014/0367795 A1 | 12/2014 | Cai et al. | |
| 2014/0374838 A1 | 12/2014 | Chen et al. | |
| 2015/0034941 A1 | 2/2015 | Hargrove et al. | |
| 2015/0137237 A1 | 5/2015 | Jacob et al. | |
| 2015/0145068 A1 | 5/2015 | Chen et al. | |

* cited by examiner

*Primary Examiner* — Long Pham
(74) *Attorney, Agent, or Firm* — F. Chau & Associates, LLC

(57) ABSTRACT

A semiconductor device including: a fin-type pattern protruding from a substrate and including a first side surface and a second side surface opposite each other; a first trench in contact with the first side surface; a second trench in contact with the second side surface; a first liner formed conformally on a side surface and a bottom surface of the first trench; a first field insulating film disposed on the first liner and partially filling the first trench; a second liner formed conformally on a side surface of the second trench and exposing a bottom surface of the second trench; and a second field insulating film disposed on the second liner and partially filling the second trench.

20 Claims, 38 Drawing Sheets

1300

1400

SEMICONDUCTOR DEVICE AND A FABRICATING METHOD THEREOF

TECHNICAL FIELD

The present inventive concept relates to a semiconductor device and a fabricating method thereof.

DESCRIPTION OF THE RELATED ART

A multigate transistor has been developed to increase the density of semiconductor devices. In the multigate transistor, there is provided a silicon body in a fin or nanowire shape formed on a substrate, with a gate being formed on a surface of the silicon body.

SUMMARY

According to an exemplary embodiment of the present inventive concept, there is provided a semiconductor device, comprising a fin-type pattern protruding from a substrate and comprising a first side surface and a second side surface opposite each other, a first trench in contact with the first side surface, a second trench in contact with the second side surface, a first liner formed conformally on a side surface and a bottom surface of the first trench, a first field insulating film disposed on the first liner and partially filling the first trench, a second liner formed conformally on a side surface of the second trench and exposing a bottom surface of the second trench and a second field insulating film disposed on the second liner and partially filling the second trench.

A width of the first trench is smaller than a width of the second trench.

A depth of the first trench is smaller than a depth of the second trench.

An upper surface of the second field insulating film is higher than, or coincident with an upper surface of the first field insulating film.

The semiconductor device further comprises a gate electrode formed on the fin-type pattern and the first and second field insulating films.

The gate electrode comprises a first portion and a second portion, the first portion is overlapped with the first field insulating film, the second portion is overlapped with the first field insulating film, and a thickness of the second portion is thinner than that of the first portion.

The second liner comprises a side region formed conformally on the side surface of the second trench, and a bottom region connected with the side region and formed conformally along a portion of the bottom surface of the second trench, the second field insulating film comprises a first region in contact with the side region, and a second region in contact with the first region and spaced apart from the side region by the first region, and a height of an upper surface of the first region is lower than a height of an upper surface of the second region.

The height of the upper surface of the first region is the same as the height of the upper surface of the first field insulating film.

The second liner comprises a side region formed conformally on the side surface of the second trench, and a bottom region connected with the side region and formed conformally along a portion of the bottom surface of the second trench.

The second field insulating film comprises a first region in contact with the side region, and a second region in contact with the first region and spaced apart from the side region by the first region.

An etch rate of the first region is different from an etch rate of the second region.

The first region and the second region comprise different materials from each other.

The first region is spaced apart from the substrate, and the second region is in direct contact with the substrate.

A bottom surface of the first region is higher than a bottom surface of the second region.

A height of an upper surface of the side region is the same as a height of an upper surface of the second field insulating film.

A height of an uppermost portion of the first liner is the same as a height of an uppermost portion of the second liner.

The height of the uppermost portion of the first liner is the same as a height of an uppermost portion of the first field insulating film. According to an exemplary embodiment of the present inventive concept, there is provided a semiconductor device, comprising a first fin-type pattern and a second fin-type pattern, a first trench formed between the first fin-type pattern and the second fin-type pattern, a first liner in contact with the first fin-type pattern and formed conformally on a sidewall and a bottom surface of the first trench, a second liner in contact with the second fin-type pattern, spaced apart from the first liner, and formed conformally on the sidewall and the bottom surface of the first trench and a first field insulating film filling the first trench, wherein the first field insulating film comprises a first insulating film formed on the first liner, a second insulating film formed on the second liner, and a third insulating film formed between the first insulating film and the second insulating film.

An upper surface of the third insulating film is higher than upper surfaces of the first insulating film and the second insulating film.

The semiconductor device further comprises a first capping film disposed on the first insulating film and in contact with the first liner and the third insulating film.

The semiconductor device further comprises a second capping film disposed on the second insulating film and in contact with the second liner and the third insulating film.

A bottom surface of the third insulating film is lower than bottom surfaces of the first insulating film and the second insulating film.

The bottom surface of the first trench comprises a first region overlapped with the first liner and the second liner, and a second region overlapped with the third insulating film, wherein the second region is lower than the first region.

According to an exemplary embodiment of the present inventive concept, there is provided a semiconductor device, comprising first, second and third fin-type patterns protruding from a substrate, a first trench formed between the first fin-type pattern and the second fin-type pattern, a second trench formed between the second fin-type pattern and the third fin-type pattern and having a wider width than the first trench, a first liner formed along a bottom surface and first and second side surfaces of the first trench, a second liner formed along a bottom surface and a side surface of the second trench and exposing a portion of the bottom surface of the second trench, a first field insulating film disposed on the first liner and partially filling the first trench; and a second field insulating film disposed on the second liner and partially filling the second trench.

The first liner exposes a portion of the first or second side surfaces of the first trench.

The second liner exposes a portion of the side surface of the second trench.

The first liner exposes an upper portion of the first or second side surfaces of the first trench.

According to an exemplary embodiment of the present inventive concept, there is provided a fabricating method of a semiconductor device, comprising forming a dummy fin-type pattern and a first fin-type pattern protruding from a substrate, wherein a first trench is disposed adjacent to the first fin-type pattern, a first liner is formed along a side surface and a bottom surface of the first trench, and a first field insulating film fills the first trench, removing a portion of the first field insulating film, wherein an upper portion of the dummy fin-type pattern and the first fin-type pattern protrude beyond the first field insulating film, forming a capping film on the dummy fin-type pattern and the first fin-type pattern, forming a second trench by removing the dummy fin-type pattern, wherein the second trench exposes an upper surface of the substrate, forming a second field insulating film filling the second trench, removing a portion of the second field insulating film, wherein an upper portion of the first fin-type pattern is protruded beyond the second field insulating film and exposing the upper portion of the first fin-type pattern.

Prior to removing the portion of the first field insulating film, the method further comprises forming a mask pattern on the dummy fin-type pattern and the first fin-type pattern.

Exposing the upper portion of the first fin-type pattern comprises removing the mask pattern.

Removing the portion of the first field insulating film comprises removing the mask pattern.

The capping film comprises an oxide film, and a nitride film formed on the oxide film.

The dummy fin-type pattern and the first fin-type pattern extend in a first direction, and each comprise first, second and third regions disposed in sequence in the first direction, the capping film comprises a first capping film and a second capping film formed on the first capping film, and forming the capping film comprises, forming the first capping film, separating the first and the third regions from each other by removing the second region, and forming the second capping film on the first capping film.

The first capping film comprises an oxide film, and the second capping film comprises a nitride film.

According to an exemplary embodiment of the present inventive concept, there is provided a fabricating method of a semiconductor device, comprising forming a first fin-type pattern and a dummy fin-type pattern, wherein the first and dummy fin-type patterns protrude from a substrate and are spaced apart from each other, a first trench having a first width is disposed between the first fin-type pattern and the dummy fin-type pattern, forming a first liner along side surfaces and a bottom surface of the first trench, and a first field insulating film on the first liner and partially filling the first trench, forming a capping film covering the first field insulating film and the first and dummy fin-type patterns, forming a second trench having a second width which is wider than the first width, by removing the dummy fin-type pattern, forming a second liner along side surfaces and a bottom surface of the second trench, wherein the second liner exposes the bottom surface of the second trench and forming a second field insulating film on the second liner and partially filling the second trench, wherein an upper surface of the second field insulating film is higher than, or the same height as an upper surface of the first field insulating film.

Forming the first field insulating film comprises subjecting the first field insulating film to heat treatment.

Forming the second field insulating film comprises subjecting the second field insulating film to heat treatment.

The first and second field insulating films comprise a same material.

According to an exemplary embodiment of the present inventive concept, there is provided a semiconductor device comprising: a first body protruded from a substrate, the first body having a first side and a second side; a first trench disposed on the first side of the first body, the first trench having a first width, a first liner disposed on its sidewalls and bottom surface, and being filled with a first insulation film; a second trench disposed on the second side of the first body, the second trench having a second width greater than the first width, a second liner disposed on its sidewalls and exposing a bottom surface thereof, and being filled with a second insulation film.

The first body includes silicon.

The first body has a fin or nanowire shape.

An upper surface of the second insulating film is higher than an upper surface of the first insulating film.

An upper surface of the second insulating film and an upper surface of the first insulating film have the same height from the substrate.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present.

The use of the terms "a" and "an" and "the" and similar referents in the context of describing the inventive concept are to be construed to cover both the singular and the plural, unless otherwise indicated herein or clearly contradicted by context.

As used herein, the term "and/or" includes any and all combinations of one or more of the associated listed items. Also, the term "exemplary" is intended to refer to an example or illustration.

Hereinbelow, a semiconductor device according to an exemplary embodiment of the present inventive concept will be explained with reference to FIGS. 1 and 2.

Figure 1:
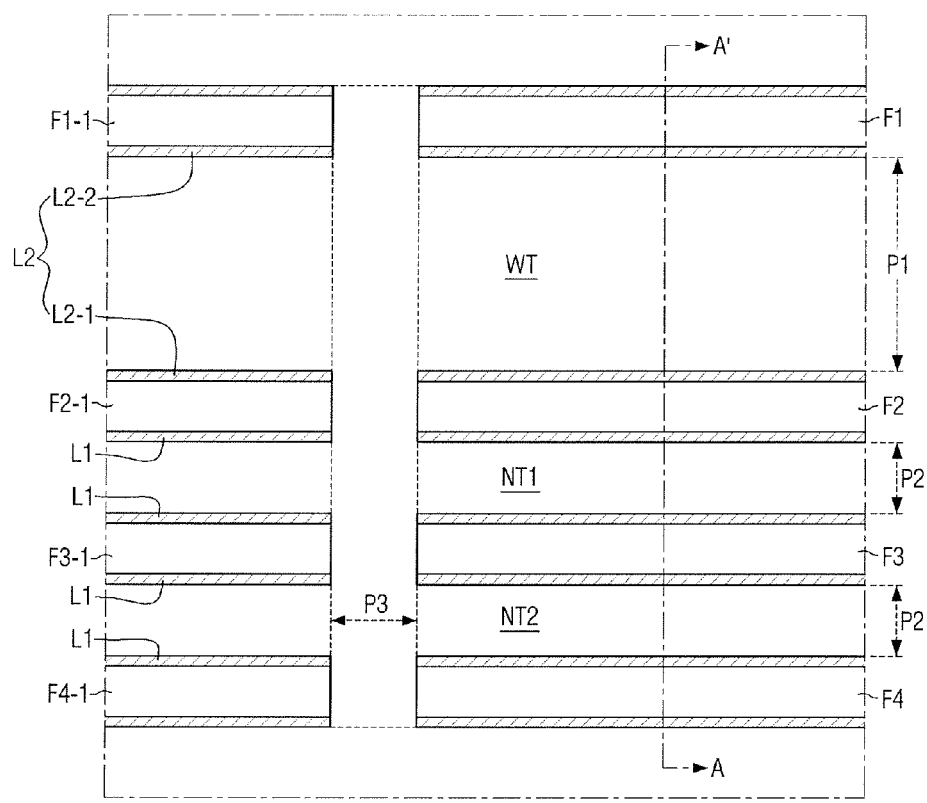
FIG. 1 is a layout diagram provided to explain a semiconductor device according to an exemplary embodiment of the present inventive concept.
Figure 2:
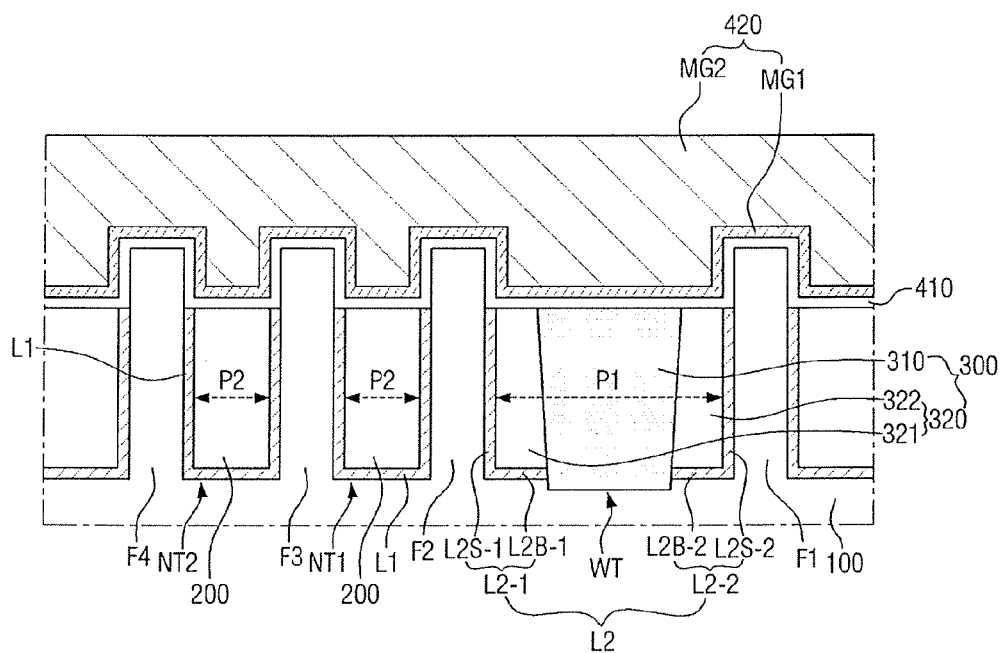
FIG. 2 is a cross sectional view taken along line A-A' of FIG. 1.

FIG. 1 is a layout diagram provided to explain a semiconductor device according to an exemplary embodiment of the present inventive concept, and FIG. 2 is a cross sectional view taken along line A-A' of FIG. 1.

Referring to FIGS. 1 and 2, the semiconductor device according to an exemplary embodiment of the present inventive concept includes a substrate 100, first, second, third and fourth fin-type patterns F1, F2, F3 and F4, a first liner L1, a second liner L2, a wide trench WT, first and second narrow trenches NT1, NT2, a first field insulating film 200, a second field insulating film 300, a gate insulating film 410, and a gate electrode 420. Although fin-type patterns are hereinafter described with reference to exemplary embodiments, the inventive concept is not limited thereto and may include nanowires.

The substrate 100 may be a bulk silicon or a silicon-on-insulator (SOI), for example. In addition, the substrate 100 may be a silicon substrate, or may include other substance such as silicon germanium, indium antimonide, a lead telluride compound, indium arsenide, indium phosphide, gallium arsenide, or gallium antimonide. In addition, the substrate 100 may be a base substrate having an epitaxial layer formed thereon.

The first to the fourth fin-type patterns F1 to F4 may protrude from the substrate 100. The first to the fourth fin-type patterns F1 to F4 may be a portion of the substrate 100. In addition, the first to the fourth fin-type patterns F1 to T4 may be grown on the substrate 100.

The first to the fourth fin-type patterns F1 to F4 may each extend in a first direction. The first to the fourth fin-type patterns F1 to F4 may be spaced apart from each other in a second direction. The second direction may be a direction that intersects the first direction. For example, the first direction and the second direction may be orthogonal to each other. However, exemplary embodiments of the present inventive concept are not limited to the example given above.

Trenches may be formed among the first to the fourth fin-type patterns F1 to F4. For example, the wide trench WT may be formed between the first fin-type pattern F1 and the second fin-type pattern F2. The first narrow trench NT1 may be formed between the second fin-type pattern F2 and the third fin-type pattern F3. The second narrow trench NT2 may be formed between the third fin-type pattern F3 and the fourth fin-type pattern F4.

The width P1 of the wide trench WT in the second direction may be wider than the width P2 of the first and the second narrow trenches NT1, NT2. The first and the second narrow trenches NT1, NT2 may have the same width P2. In other words, the distance P1 between the first fin-type pattern F1 and the second fin-type pattern F2 may be greater than the distance P2 between the second fin-type pattern F2 and the third fin-type pattern F3. The distance P2 between the second fin-type pattern F2 and the third fin-type pattern F3 may be same as the distance P2 between the third fin-type pattern F3 and the fourth fin-type pattern F4. The word "same" as used herein may encompass minute differences and may refer to a same manner of fabrication.

The first to the fourth fin-type patterns F1 to F4 may include first, second and third regions. Take the first fin-type pattern F1 for example, the first fin-type pattern F1 may have two regions which are spaced apart in the first direction. In other words, the first fin-type pattern F1 may include a first region F1 and a third region F1-1. Further, the second region located between the first region F1 and the third region F1-1 may be removed. Accordingly, the first region F1 and the third region F1-1 may be spaced apart from each other by the width P3 of the second region in the first direction.

In addition, the second fin-type pattern F2 may include a first region F2 and a third region F2-1, the third fin-type pattern F3 may include a first region F3 and a third region F3-1, and the fourth fin-type pattern F4 may include a first region F4 and a third region F4-1. The second regions, removed from the first to the fourth fin-type patterns F1 to F4, may be aligned in the second direction. The second regions, removed from the first to the fourth fin-type patterns F1 to F4, may all have the same width P3 in the first direction. In other words, as illustrated, the first region and the third region may be spaced apart from each other by a predetermined width P3.

The first liner L1 may be formed along the sidewalls and bottom surfaces of the first narrow trench NT1 and the second narrow trench NT2. The first liner L1 may partially cover the sidewalls of the first and the second narrow trenches NT1, NT2, and entirely cover the bottom surfaces of the first and the second narrow trenches NT1, NT2. The first liner L1 may be formed in the same shape in the first and the second narrow trenches NT1, NT2. The first liner L1 may expose the upper portions of the side surfaces of the first and the second narrow trenches NT1, NT2. The first liner L1 may be formed symmetrically in the first and the second narrow trenches NT1, NT2. In other words, the first liner L1 may be formed on both sidewalls of the first and the second narrow trenches NT1, NT2 to the same height.

The second liner L2 may be formed along the sidewall and the bottom surface of the wide trench WT. The second liner L2 may partially cover the sidewall of the wide trench WT and partially cover the bottom surface of the wide trench WT. The second liner L2 may expose the upper portion of the side surface of the wide trench WT. The second liner L2 may be formed symmetrically in the wide trench WT. In other words, the second liner L2 may be formed on both sidewalls of the wide trench WT to the same height.

The second liner L2 may be formed only at a portion of the bottom surface of the wide trench WT. Accordingly, a portion of the upper surface of the substrate 100 may be exposed at the bottom surface of the wide trench WT. The second liner L2 may include two liners formed along the bottom surface of the wide trench WT and connected to the sidewall of the wide trench WT.

In other words, the second liner L2 may include a first side liner L2-1 and a second side liner L2-2. Among the two liners, the first side liner L2-1 is the part of the second liner L2 in contact with the second fin-type pattern F2, and the second side liner L2-2 is the part of the second liner L2 in contact with the first fin-type pattern F1. The first side liner L2-1 and the second side liner L2-2 may be separated from each other. The area where the first and second side liners L2-1 and L2-2 are separated may be where the bottom surface of the wide trench WT described above is exposed.

The second liner L2 includes side regions L2S-1, L2S-2, and bottom regions L2B-1, L2B-2. For example, the side regions L2S-1, L2S-2 are portions of the second liner L2 that are in contact with the side surface of the wide trench WT. The side regions L2S-1, L2S-2 may be formed conformally along the side surface of the wide trench WT, and may expose the upper portion of the sidewall of the wide trench WT. The side regions L2S-1, L2S-2 may be connected with the bottom regions L2B-1, L2B-2 at a connecting area where the side surface and the bottom surface of the wide trench WT meet.

The bottom regions L2B-1, L2B-2 may be connected with the side regions L2S-1, L2S-2 at a connecting area between the side surface and the bottom surface of the wide trench WT. The bottom regions L2B-1, L2B-2 are the portions that are in contact with the bottom surface of the wide trench WT. The bottom regions L2B-1, L2B-2 of the first side liner L2-1 and the bottom regions L2B-1, L2B-2 of the second side liner L2-2 may be separated from each other.

In the wide trench WT, the bottom surface that is not in contact with the bottom regions L2B-1, L2B-2 may be lower than the bottom surface in contact with the bottom regions L2B-1, L2B-2. This is so because the wide trench WT is formed by re-etching the narrow trench. In other words, a portion of the bottom surface of the wide trench WT may be formed into a lower region than the existing narrow trench region. Accordingly, the bottom surface of the wide trench WT may be lower than the bottom surfaces of the first and the second narrow trenches NT1, NT2. For example, the bottom surface of the wide trench WT may include a region at a same level as the bottom surfaces of the first and the second narrow trenches NT1, NT2, and a bottom surface at a lower level than the bottom surfaces of the first and the second narrow trenches NT1, NT2.

The first liner L1 and the second liner L2 may include an insulating material. For example, the first liner L1 and the second liner L2 may include SiN. However, exemplary embodiments of the present inventive concept are not limited to the example given above. The first liner L1 and the second liner L2 may be single- or multi-layer structures. The first liner L1 and the second liner L2 may include a same material. The first liner L1 and the second liner L2 may be formed by a same process.

The first field insulating film 200 may fill the first and the second narrow trenches NT1, NT2. The first field insulating film 200 may partially fill the first and the second narrow trenches NT1, NT2. The upper surface of the first field insulating film 200 may be lower than the upper surfaces of the first to the fourth fin-type patterns F1 to F4. In other words, the first field insulating film 200 may expose the upper portions of the first to the fourth fin-type patterns F1 to F4. The uppermost portion of the upper surface of the first liner L1 may have a same height as the upper surface of the first field insulating film 200. Accordingly, the first field insulating film 200 and the first liner L1 may expose the upper portions of the first to the fourth fin-type patterns F1 to F4.

The second field insulating film 300 may fill the wide trench WT. The second insulating film 300 may partially fill the wide trench WT. The upper surface of the second field insulating film 300 may be lower than the upper surfaces of the first to the fourth fin-type patterns F1 to F4. In other words, the second field insulating film 300 may expose the upper portions of the first to the fourth fin-type patterns F1 to F4. The uppermost portion of the upper surface of the second liner L2 may also have the same height as the upper surface of the second field insulating film 300. Accordingly, the second field insulating film 300 and the second liner L2 may expose the upper portions of the first to the fourth fin-type patterns F1 to F4.

The upper surface of the first field insulating film 200 and the upper surface of the second field insulating film 300 may have the same height. Further, the uppermost portion of the upper surface of the first liner L1 and the uppermost portion of the upper surface of the second liner L2 may have the same height.

The first field insulating film 200 and the second field insulating film 300 may include, for example, at least one of silicon oxide, silicon nitride, silicon oxynitride, and a low-k dielectric material with a smaller dielectric constant than silicon oxide. For example, the low-k dielectric material may include flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, a porous polymeric material, or a combination thereof, but is not limited thereto.

The second field insulating film 300 may include a side insulating film 320 and a center insulating film 310. The side insulating film 320 may include a first side insulating film 321 adjacent to the second fin-type pattern F2, and a second side insulating film 322 adjacent to the first fin-type pattern F1.

The first side insulating film 321 may be formed on the first side liner L2-1. The first side insulating film 321 may be in contact with the side region L2S-1 and the bottom region L2B-1 of the first side liner L2-1. The first side insulating film 321 may be in contact with the center insulating film 310, and positioned between the center insulating film 310 and the side region L2S-1 of the first side liner L2-1.

The second side insulating film 322 may be formed on the second side liner L2-2. The second side insulating film 322 may be in contact with the side region L2S-2 and the bottom region L2B-2 of the second side liner L2-2. The second side insulating film 322 may be in contact with the center insulating film 310, and positioned between the center insulating film 310 and the side region L2S-2 of the second side liner L2-2.

The center insulating film 310 may be positioned between the first side insulating film 321 and the second side insulating film 322. The center insulating film 310 may be in contact with the bottom regions L2B-1, L2B-2 of the first side liner L2-1 and the second side liner L2-2, but may not be in contact with the side regions L2S-1, L2S-2 of the first side liner L2-1 and the second side liner L2-2.

The center insulating film 310 may be in direct contact with a portion of the bottom surface of the wide trench WT, at which the second liner L2 is not formed. The lower surface of the center insulating film 310 may be lower than the lower surface of the second liner L2, since the portion of the bottom surface of the wide trench WT without the second liner L2 is lower than the portion of the bottom surface of the wide trench WT with the second liner L2. Furthermore, the lower surface of the side insulating film 320 formed on the second liner L2 may be higher than the lower surface of the center insulating film 310.

As illustrated in FIG. 1, the side surface of the center insulating film 310 may have a slope. This may be formed in accordance with the etching characteristic of the fin cut process. According to the slope, the width of the center insulating film 310 may be narrowed in a depth-wise direction. However, exemplary embodiments of the present inventive concept are not limited to the example given above.

The gate electrode 420 and the gate insulating film 410 may be formed in a direction of intersecting the first to the fourth fin-type patterns F1 to F4. The gate insulating film 410 may be formed on the first field insulating film 200, the second field insulating film 300, the first liner L1, the second liner L2 and the first to the fourth fin-type patterns F1 to F4. The gate insulating film 410 may be formed conformally along the surfaces of the first field insulating film 200, the second field insulating film 300, the first liner L1, the second liner L2 and the first to the fourth fin-type patterns F1 to F4. The gate electrode 420 may be formed on the gate insulating film 410.

The gate insulating film 410 may include an interface film and a high-k dielectric film. The interface film may be formed by partially oxidizing the first to the fourth fin-type patterns F1 to F4. When the first to the fourth fin-type patterns F1 to F4 are silicon fin-type patterns that contain silicon, the interface film may contain a silicon oxide film.

For example, the high-k dielectric film may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The gate electrode 420 may include a first metal layer MG1 and a second metal layer MG2. In addition, the gate electrode 420 may have two or more metal layers stacked on one another. The first metal layer MG1 adjusts a work function, and the second metal layer MG2 fills a space defined by the first metal layer MG1. For example, the first metal layer MG1 may include at least one of, for example, TiN, WN, TiAl, TiAlN, TaN, TiC, TaC, TaCN, TaSiN and a combination thereof, but is not limited thereto. Further, the second metal layer MG2 may include at least one of, for example, W, Al, Cu, Co, Ti, Ta, poly-Si, SiGe and a metal alloy, but is not limited thereto.

For example, the gate electrode 420 described above may be formed by a replacement process (or a gate last process), but is not limited thereto.

According to exemplary embodiments of the present inventive concept, the semiconductor device can have enhanced reliability and performance, because by using the first liner L1 and the second liner L2, it is possible to prevent damage to the first to the fourth fin-type patterns F1 to F4 during manufacture. In addition, the semiconductor device can enhance uniformity between the first field insulating film 200 and the second field insulating film 300.

In other words, since the first field insulating film 200 and the second field insulating film 300 have the same height, the areas of exposure of the first to the fourth fin-type patterns F1 to F4 are uniform, thus leading into enhanced uniformity of the semiconductor device. As a result, the semiconductor device can have enhanced reliability and performance.

Hereinbelow, a semiconductor device according to an exemplary embodiment of the present inventive concept will be described with reference to FIG. 3. It is to be understood that elements or operations in FIG. 3 are similar to or the same as those described above with reference to FIGS. 1 and 2 and thus will be mentioned briefly or omitted for the sake of brevity.

Figure 3:
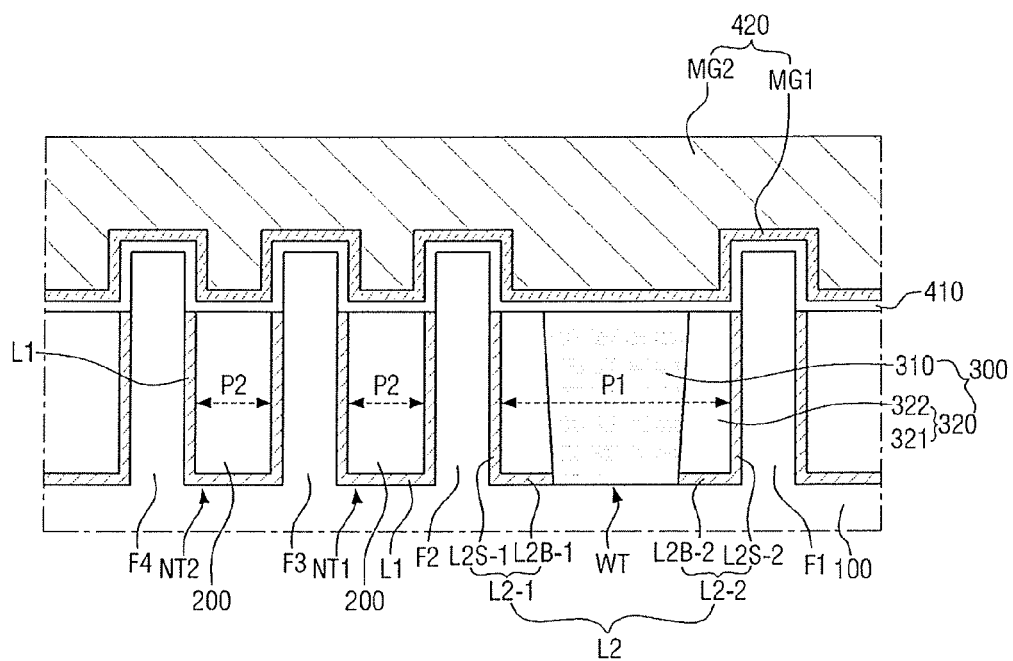
FIG. 3 is a cross sectional view provided to explain a semiconductor device according to an exemplary embodiment of the present inventive concept.

FIG. 3 is a cross sectional view provided to explain a semiconductor device according to an exemplary embodiment of the present inventive concept.

Referring to FIG. 3, the bottom surface of the wide trench WT of the semiconductor device according to an exemplary embodiment of the present inventive concept may be at a same height as the bottom surfaces of the first and the second narrow trenches NT1, NT2. Further, the bottom surface of the wide trench WT may be at a same height as a portion of the wide trench WT overlapped with the second liner L2, and a portion of the wide trench WT not overlapped with the second liner L2.

Accordingly, the lower surface of the center insulating film 310 and the lower surface of the second liner L2 may have the same height. Note that the lower surface of the side insulating film 320 may still be higher than the lower surface of the center insulating film 310, since the lower surface of the side insulating film 320 is formed on the second liner L2.

Hereinbelow, a semiconductor device according to an exemplary embodiment of the present inventive concept will be described with reference to FIG. 4. It is to be understood that elements or operations in FIG. 4 are similar to or the same as those described above with reference to FIGS. 1 to 3 and thus will be mentioned briefly or omitted for the sake of brevity.

Figure 4:
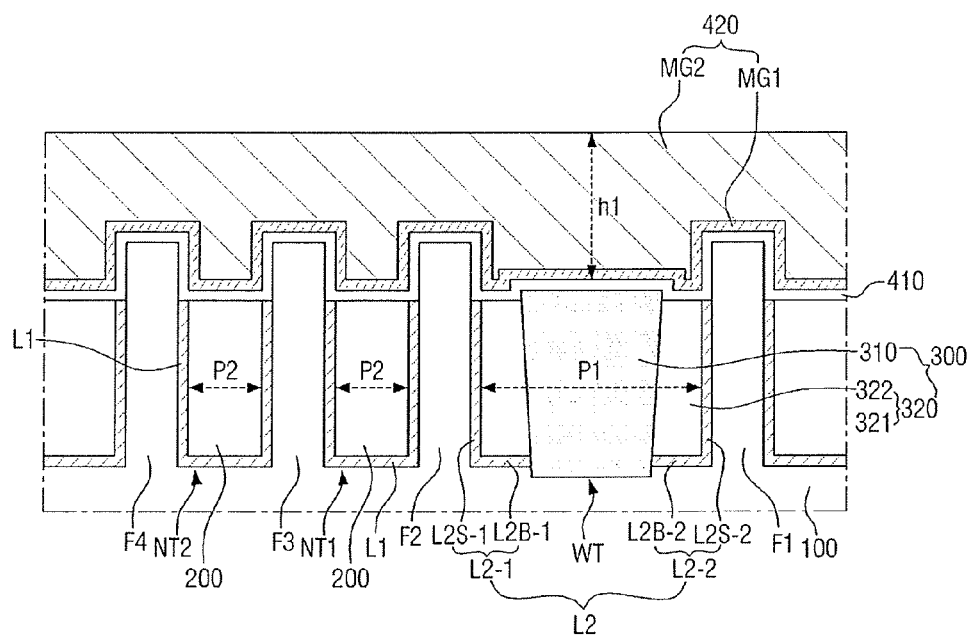
FIG. 4 is a cross sectional view provided to explain a semiconductor device according to an exemplary embodiment of the present inventive concept.

FIG. 4 is a cross sectional view provided to explain a semiconductor device according to an exemplary embodiment of the present inventive concept.

Referring to FIG. 4, the upper surface of the center insulating film 310 may be higher than the upper surface of the side insulating film 320. The height of the upper surface of the side insulating film 320 may be same as the height of the upper surface of the first field insulating film 200 of the first narrow trench NT1 and the second narrow trench NT2. Accordingly, the upper surfaces of the center insulating film 310 and the side insulating film 320 may have different heights from each other.

As illustrated in FIG. 4, there may be a stepped portion formed between the upper surface of the side insulating film 320 and the upper surface of the center insulating film 310, although exemplary embodiments of the present inventive concept are not limited thereto. In addition, the upper surface of the side insulating film 320 and the upper surface of the center insulating film 310 may be continuously connected. Note that the upper surface of the center insulating film 310 may be higher than the upper surface of the side insulating film 320.

When the upper surface of the center insulating film 310 becomes higher, the corresponding thickness h1 of the gate electrode 420 becomes smaller. From a three dimensional perspective, it can be considered that the volume of the gate electrode 420 decreases when the thickness h1 of the gate electrode 420 decreases.

When the thickness and the volume of the gate electrode 420 decrease, the effective capacitance of the gate electrode 420 may decrease. Accordingly, the semiconductor device can have further increased alternating current (AC) performance and reliability.

In other words, since the center insulating film 310 of the second field insulating film 300 is formed on a wider region than the first field insulating film 200 of the first and the second narrow trenches NT1, NT2, its upper surface may be relatively easier to adjust.

Accordingly, the height of the upper surface of the center insulating film 310 of the second field insulating film 300 may be adjusted to the height of the first field insulating film 200 of the first and the second narrow trenches NT1, NT2, to ensure enhanced uniformity of the semiconductor device. In addition, as described above, to increase AC performance of the semiconductor device, the upper surface of the center insulating film 310 can be formed at a height exceeding the height of the first field insulating film 200 of the first and the second narrow trenches NT1, NT2. In other words, the height of the upper surface of the center insulating film 310 can be freely adjusted depending on which performance is intended to be enhanced.

Hereinbelow, a semiconductor device according to an exemplary embodiment of the inventive concept will be described with reference to FIG. 5. It is to be understood that elements or operations in FIG. 5 are similar to or the same as those described above with reference to FIGS. 1 to 4 and thus will be mentioned briefly or omitted for the sake of brevity.

Figure 5:
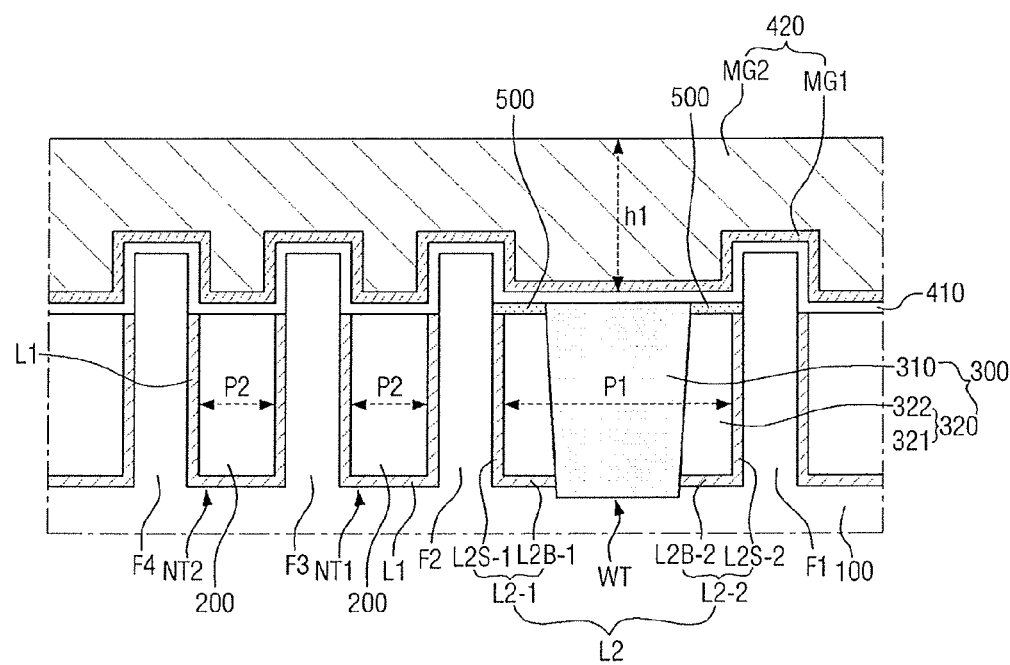
FIG. 5 is a cross sectional view provided to explain a semiconductor device according to an exemplary embodiment of the present inventive concept.

FIG. 5 is a cross sectional view provided to explain a semiconductor device according to an exemplary embodiment of the present inventive concept.

Referring to FIG. 5, the semiconductor device according to an exemplary embodiment of the present inventive concept additionally includes a capping film 500.

The capping film 500 may be formed on the second liner L2 and the side insulating film 320. The capping film 500 may be formed on both sides of the center insulating film 310. The capping film 500 may be formed under the gate insulating film 410.

For example, the capping film 500 may have a thickness corresponding to a height difference between the upper surface of the center insulating film 310 and the upper surface of the side insulating film 320. The capping film 500 may be positioned between the gate insulating film 410, the second liner L2 and the side insulating film 320.

The capping film 500 may be formed of an insulating material. The capping film 500 may have a single- or multi-layered structure. When the capping film 500 is a single layer, the capping film 500 may include a silicon nitride film. When the capping film 500 has a multi-layered structure, the capping film 500 may be in a double-layered structure of a silicon oxide film and a silicon nitride film.

The semiconductor device according to an exemplary embodiment of the present inventive concept can have enhanced AC performance, since the upper surface of the center insulating film 310 is increased, thus reducing volume of the gate electrode 420. As a result, the capping film 500 can fill the stepped portion between the center insulating film 310 and the side insulating film 320. Accordingly, since formation of air gap is prevented in the process of forming the gate insulating film 410 and the gate electrode 420, the semiconductor device can have enhanced reliability.

Hereinbelow, a fabricating method of a semiconductor device according to an exemplary embodiment of the present inventive concept will be described with reference to FIGS. 1, 2 and 6 to 17. It is to be understood that elements or operations in FIGS. 6 to 17 are the same as or similar to those described above with reference to FIGS. 1 to 5 and thus will be mentioned briefly or omitted for the sake of brevity.

Figure 6:
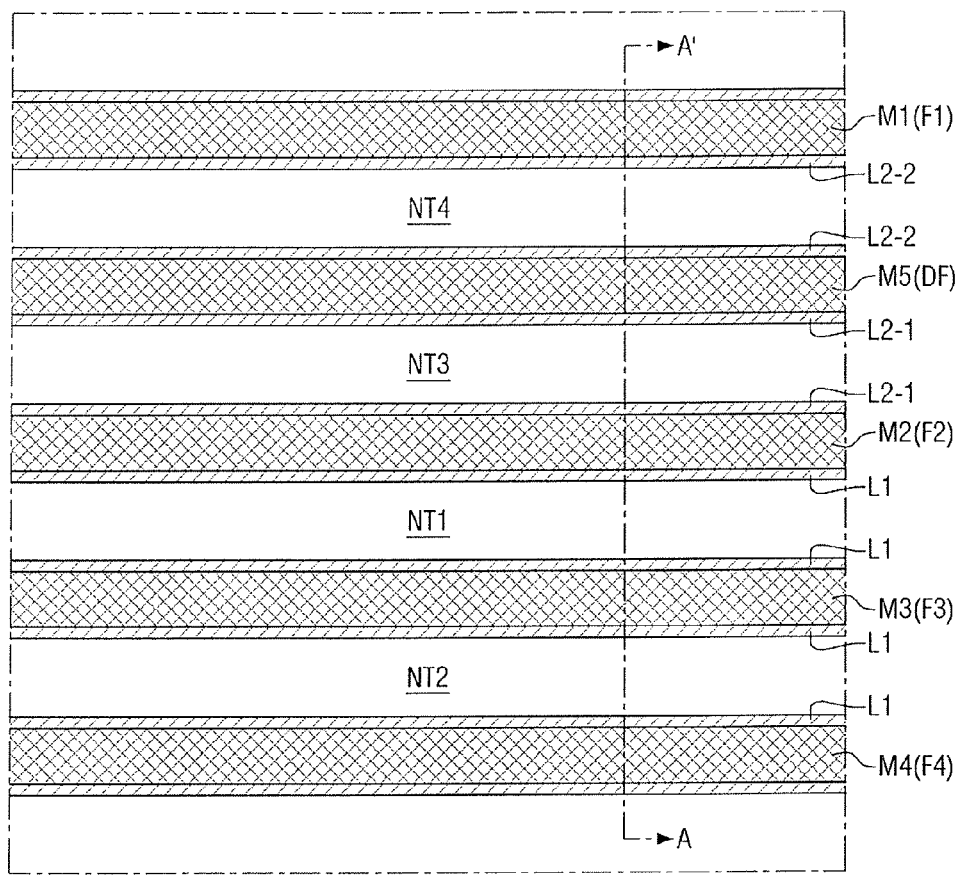
FIGS. 6, 7, 8, 9, 10, 11, 12, 13, 14, 15, 16 and 17 are views illustrating stages of fabrication, provided to explain a fabricating method of a semiconductor device according to an exemplary embodiment of the present inventive concept.
Figure 7:
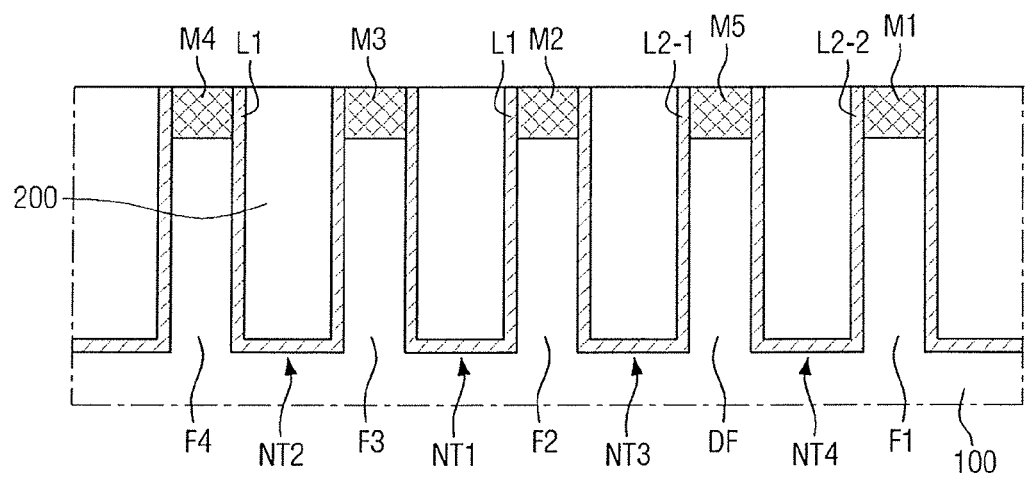
Figure 9:
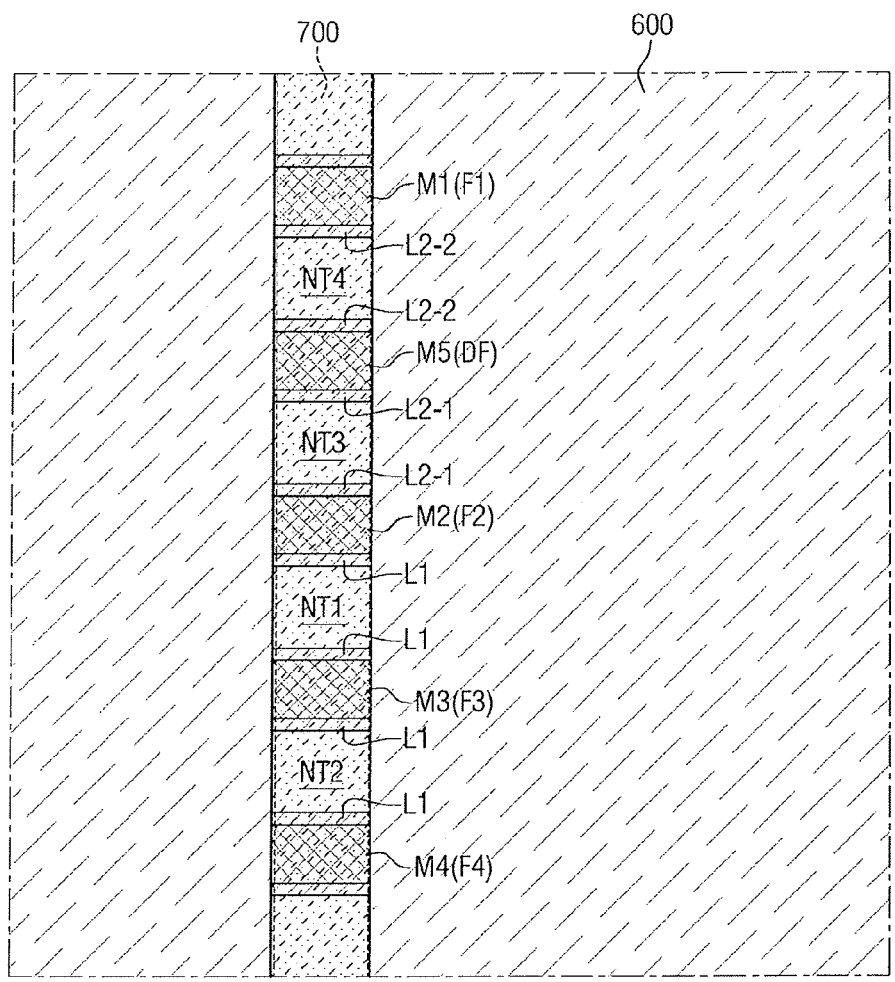
Figure 10:
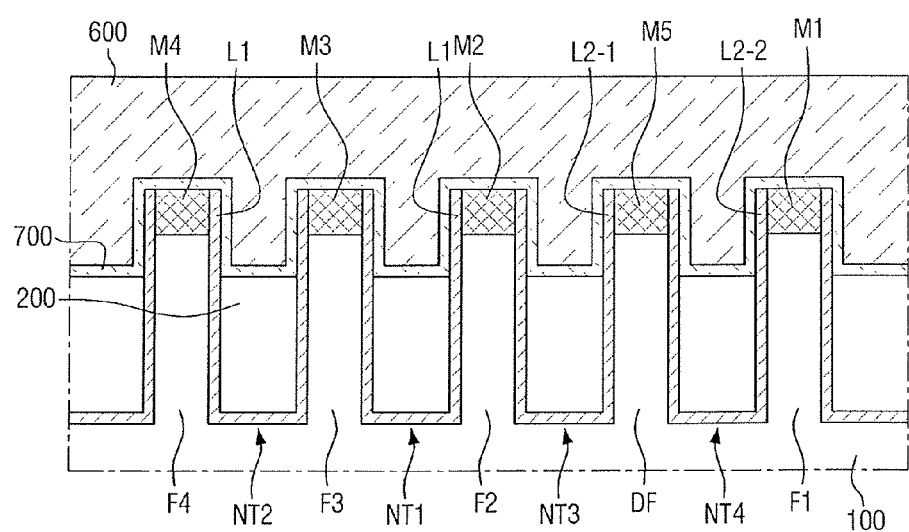
Figure 11:
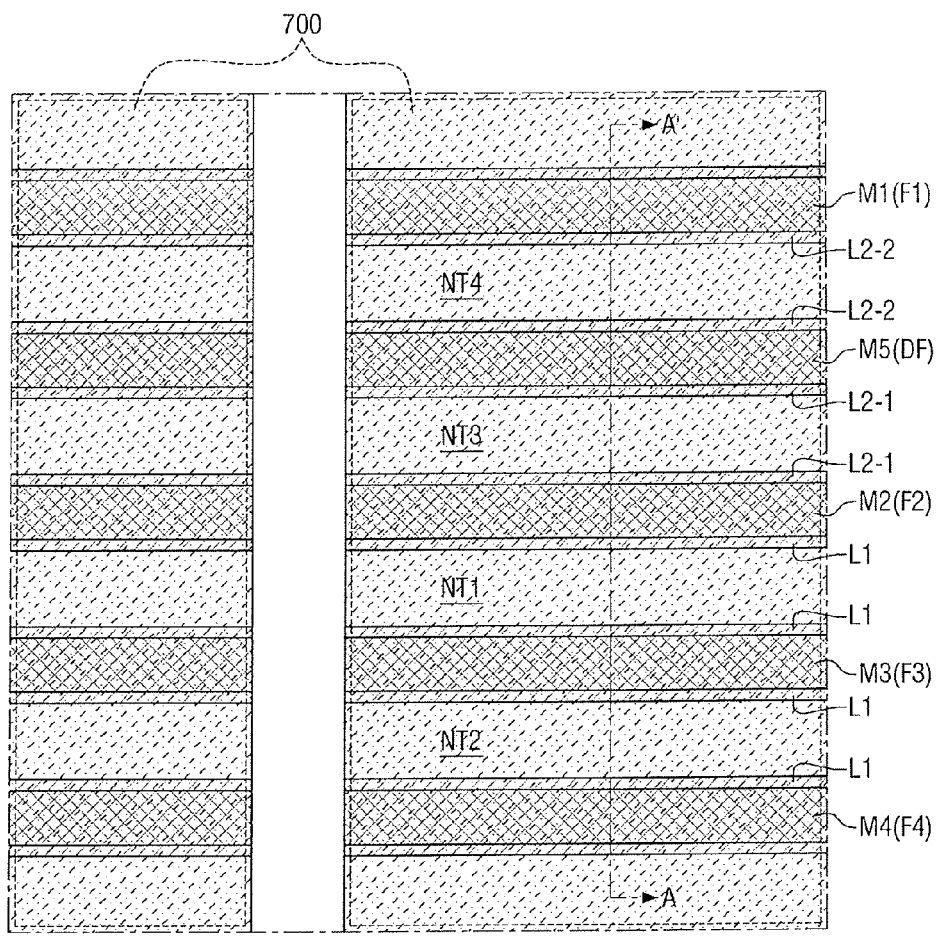
Figure 12:
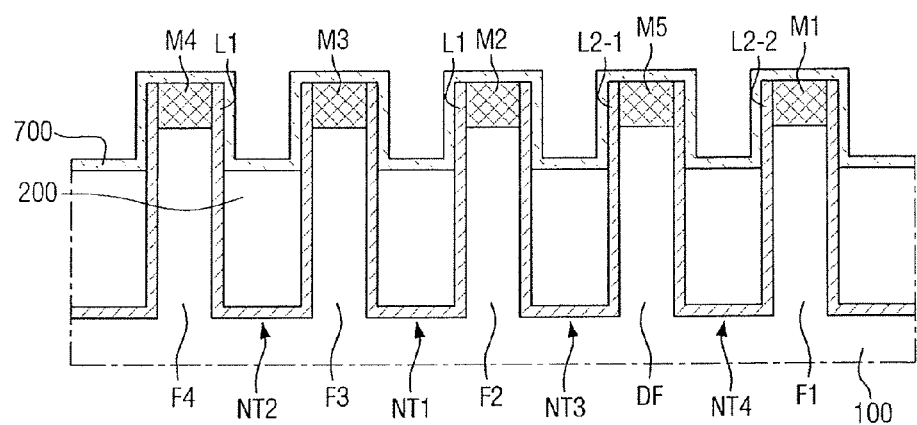
Figure 13:
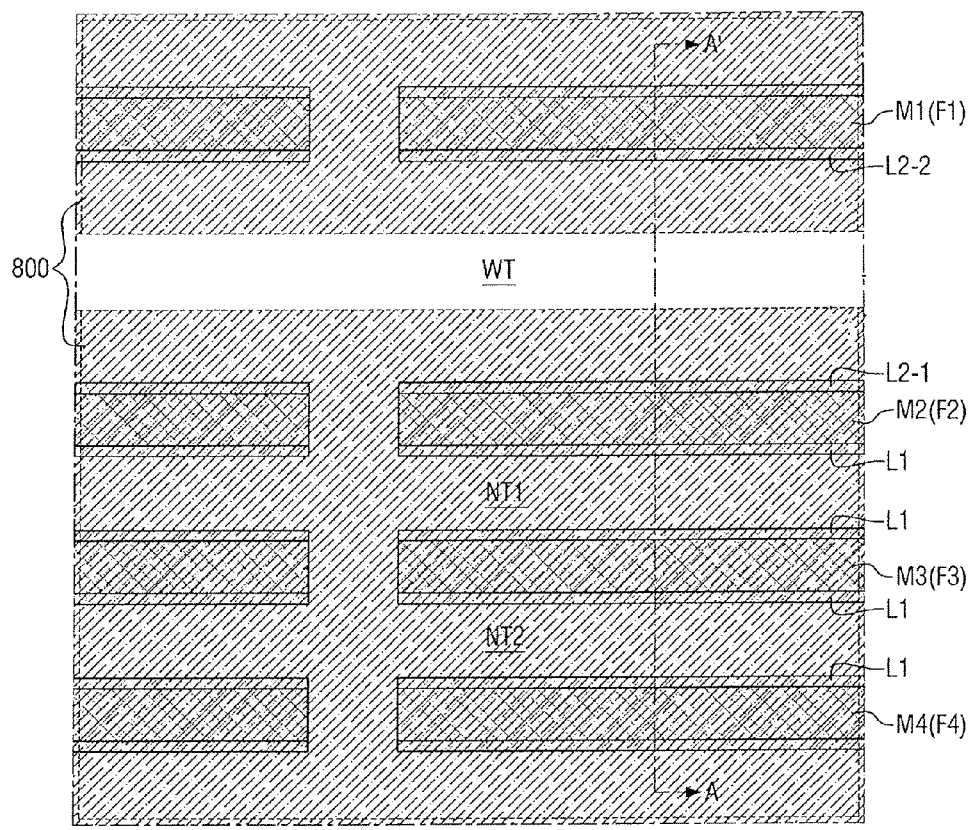
Figure 14:
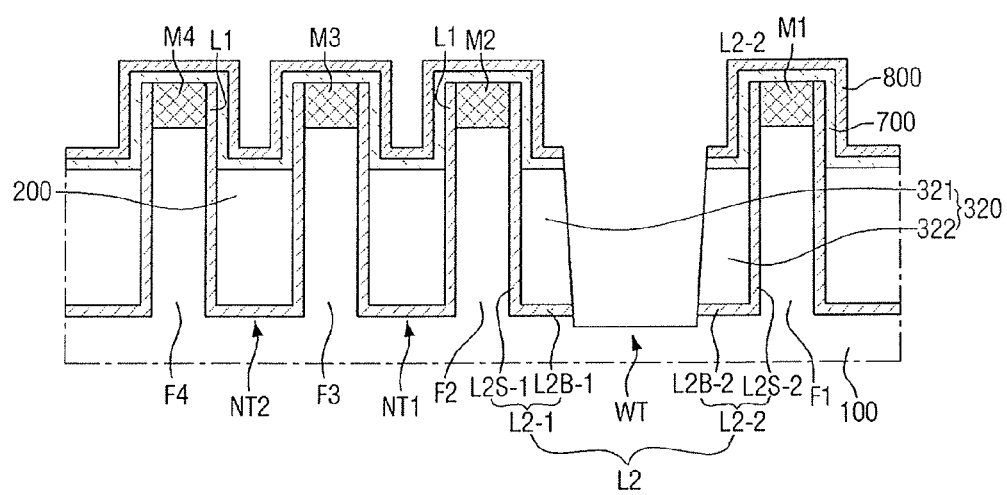

FIGS. 6 to 17 are views illustrating stages of fabrication, provided to explain a fabricating method of a semiconductor device according to an exemplary embodiment of the present inventive concept. FIG. 7 is a cross sectional view taken along line A-A' of FIG. 6, FIG. 12 is a cross sectional view taken along line A-A' of FIG. 11, and FIG. 14 is a cross sectional view taken along line A-A' of FIG. 13.

Referring to FIGS. 6 and 7, first to fourth fin-type patterns F1-T4, and a dummy fin-type pattern DF are formed.

The first to the fourth fin-type patterns F1-F4 and the dummy fin-type pattern DF may be formed by etching the substrate 100 with first to fifth mask patterns M1-M5 as masks. However, exemplary embodiments of the present inventive concept are not limited to the example given above.

The first to the fifth mask patterns M1-M5 may be positioned on the first to the fourth fin-type patterns F1-F4 and the dummy fin-type pattern DF. For example, the first to the fourth mask patterns M1-M4 may be positioned on the first to the fourth fin-type patterns F1-T4, respectively, and the fifth mask pattern M5 may be positioned on the dummy fin-type pattern DF.

The first to the fifth mask patterns M1-M5 may include a material having an etch selectivity with the substrate 100. For example, the first to the fifth mask patterns M1-M5 may include silicon nitride.

The first to the fourth fin-type patterns F1-F4 and the dummy fin-type pattern DF may all be at uniform intervals. In other words, since the first to the fifth mask patterns M1-M5 are disposed at uniform intervals, the first to the fourth fin-type patterns F1-F4 and the dummy fin-type pattern DF may also be formed at uniform intervals.

According to the formation of the first to the fourth fin-type patterns F1-F4 and the dummy fin-type pattern DF, first to fourth narrow trenches NT1-NT4 may be defined. For example, the third narrow trench NT3 may be defined between the second fin-type pattern F2 and the dummy fin-type pattern DF, and the fourth narrow trench NT4 may be defined between the first fin-type pattern F1 and the dummy fin-type pattern DF. In other words, the third narrow trench NT3 and the fourth narrow trench NT4 may be defined on both side surfaces of the dummy fin-type pattern DF, respectively, since the dummy fin-type pattern DF is positioned between the first fin-type pattern F1 and the second fin-type pattern F2.

The first liner L1 may be formed along the sidewalls and bottom surfaces of the first narrow trench NT1 and the second narrow trench NT2. The first liner L1 may entirely cover the sidewalls and the bottom surfaces of the first and the second narrow trenches NT1, NT2. The first liner L1 may be formed in the same shape in the first and the second narrow trenches NT1, NT2.

The second liner L2 may include a first side liner L2-1 and a second side liner L2-2. The first side liner L2-1 may be formed along the sidewall and the bottom surface of the third narrow trench NT3. The second side liner L2-2 may be formed along the sidewall and the bottom surface of the fourth narrow trench NT4. The first side liner L2-1 may entirely cover the sidewall and the bottom surface of the third narrow trench NT3. The second side liner L2-2 may entirely cover the sidewall and the bottom surface of the fourth narrow trench NT4. The first side liner L2-1 and the second side liner L2-2 may be formed in the same shape in the third narrow trench NT3 and the fourth narrow trench NT4, respectively.

The first liner L1 and the second liner L2 may enclose side surfaces of the first to the fifth mask patterns M1-M5. The first liner L1 and the second liner L2 may be formed conformally on the inner walls of the first to the fourth narrow trenches NT1-NT4. Accordingly, the first liner L1 and the second liner L2 may partially fill the first to the fourth narrow trenches NT1-NT4.

The first field insulating film 200 may entirely fill the first to the fourth narrow trenches NT1-NT4. The first field insulating film 200 may be positioned in each of the first to the fourth narrow trenches NT1-NT4 and separated from each other. In other words, the first field insulating film 200, the first to the fifth mask patterns M1-M5, the first liner L1 and the second liner L2 may be subject to a planarization process so that upper surfaces thereof are positioned in the same plane. As a result, the first field insulating film 200 in the first to the fourth narrow trenches NT1-NT4 may be separated, respectively.

Heat treatment may be performed after the first field insulating film 200 fills the first to the fourth narrow trenches NT1-NT4. Through the heat treatment, the first field insulating film 200 may be cured and may acquire stress properties.

Figure 8:
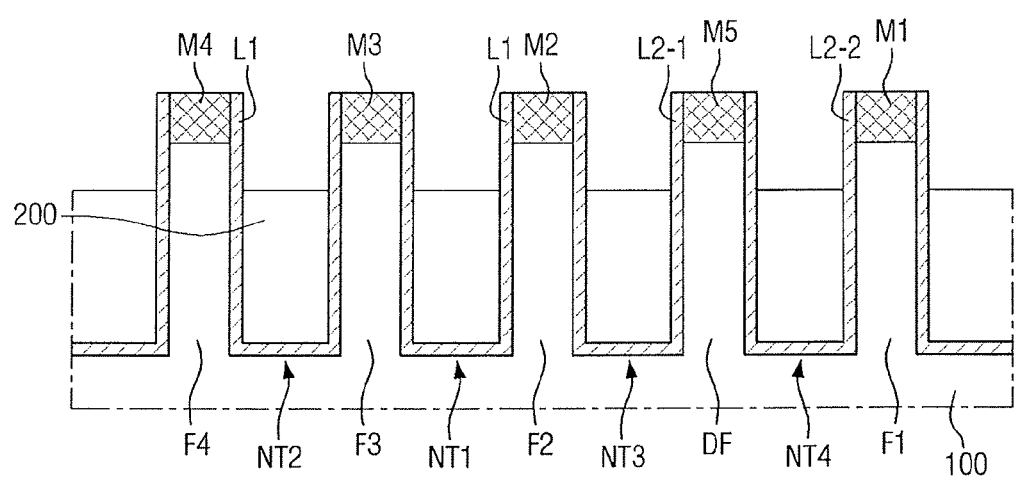

Next, referring to FIG. 8, a portion of the first field insulating film 200 is removed, thus exposing a portion of the side surfaces of the first liner L1 and the second liner L2.

The first field insulating film 200 may be removed to about the same extent by the heat treatment. In other words, the upper surface of the first field insulating film 200 in the first to the fourth narrow trenches NT1-NT4 may have a same height, respectively.

The etch rate of the first field insulating film 200 may be varied by additional processes such as heat treatment or implantation, even when the first field insulating film 200 is formed of the same material. Accordingly, the first field insulating film 200 treated with the same process may have the same property.

Next, referring to FIGS. 9 and 10, the first capping film 700 may be formed on the first liner L1, the second liner L2, and the first to the fifth mask patterns M1-M5.

The first capping film 700 may be formed conformally along the surfaces of the first liner L1, the second liner L2, and the first to the fifth mask patterns M1-M5. The first capping film 700 may be an insulating material which may be the same material as that of the first liner L1, the second liner L2, or the first to the fifth mask patterns M1-M5. However, exemplary embodiments of the present inventive concept are not limited to the example given above. For example, the first capping film 700 may include silicon nitride.

A barrier film 600 may then be formed on the first capping film 700. The barrier film 600 may partially cover the upper surface of the first capping film 700, while exposing the rest of the upper surface of the first capping film 700. Referring to FIG. 9, the barrier film 600 may expose the first capping film 700 in a direction that intersects the direction in which the first to the fourth fin-type patterns F1-F4 and the dummy fin-type pattern DF extend.

As a result, the first to the fourth fin-type patterns F1-F4 and the dummy fin-type pattern DF may be separated into two regions, respectively. For example, the first to the fourth fin-type patterns F1-F4 and the dummy fin-type pattern DF may include first to third regions, respectively. Only the first and the third regions may be covered by the barrier film 600, while the second region is exposed. In other words, among the first to the fourth fin-type patterns F1-F4 and the dummy fin-type pattern DF, portions that are covered by the barrier film 600 on the left-hand side of FIG. 9 may be the third region, and portions that are covered by the barrier film 600 on the right-hand side of FIG. 9 may be the first region. The portions of the first to the fourth fin-type patterns F1-F4 and the dummy fin-type pattern DF exposed in FIG. 9 may be the second region.

The barrier film 600 may include at least one of a photo-resist (PR) and an amorphous carbon layer (ACL). However, exemplary embodiments of the present inventive concept are not limited to the example given above. When the barrier film 600 is a photo-resist, the second region may be removed by a photolithography process.

Next, referring to FIGS. 11 and 12, the second region may be removed. The portion of the first field insulating film 200 that is not overlapped with the barrier film 600 may also be removed, in addition to the second regions of the first to the fourth fin-type patterns F1-F4 and the dummy fin-type pattern DF.

The barrier film 600 may then be removed. The removal of the barrier film 600 causes the entire upper surface of the first capping film 700 to be exposed.

Next, referring to FIGS. 13 and 14, a second capping film 800 is formed on the first capping film 700.

The second capping film 800 may be conformally formed on the first capping film 700. The second capping film 800 may be an insulating material which may be the same material as that of the first liner L1, the second liner L2, the first capping film 700, or the first to the fifth mask patterns M1-M5. However, exemplary embodiments of the present inventive concept are not limited to the example given above. For example, the second capping film 800 may include silicon nitride.

The dummy fin-type pattern DF is then removed.

Concurrently with the removal of the dummy fin-type pattern DF, a portion of the first field insulating film 200 in the third narrow trench NT3 and the fourth narrow trench NT4 may be removed. The trench, which is formed with the removal of the dummy fin-type pattern DF, may include a bottom surface which is deeper than the first to the fourth narrow trenches NT1-NT4. Combined with the portion of the third narrow trench NT3 and the fourth narrow trench NT4, the trench that is newly formed as described above may form a wide trench WT. A portion of the wide trench WT may be filled with the first field insulating film 200, the second liner L2, or the like.

Concurrently with the removal of the dummy fin-type pattern DF, the fifth mask pattern M5 may also be removed. Further, a portion of the first capping film 700 and the second capping film 800, either overlapped with, or adjacent to the dummy fin-type pattern DF, may also be removed.

At this time, the second liner L2 may be divided into a first side liner L2-1 and a second side liner L2-2. The first field insulating film 200 within the third narrow trench NT3 may be formed into a first side insulating film 321 of the second field insulating film 300. The first field insulating film 200 within the fourth narrow trench NT4 may be formed into a second side insulating film 322 of the second field insulating film 300.

Figure 15:
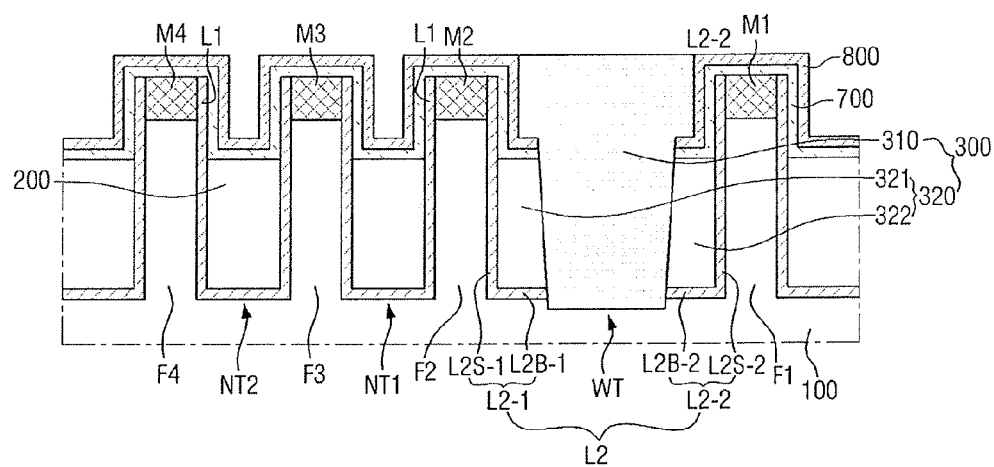

Next, referring to FIG. 15, the wide trench WT is filled.

The wide trench WT may be filled with the second field insulating film 300. The second field insulating film 300 may include the side insulating film 320 and the center insulating film 310. At this time, the side insulating film 320 may be a portion of the first field insulating film 200 which was formed previously. The center insulating film 310 may be newly filled. The center insulating film 310 may entirely fill the wide trench WT.

At this time, the material of the center insulating film 310 may be same as the material of the first field insulating film 200. However, exemplary embodiments of the present inventive concept are not limited to the example given above.

The center insulating film 310 may be subject to heat treatment after filling the wide trench WT. Through the heat treatment, the second field insulating film 300 may be cured and may acquire stress properties. At this time, the first field insulating film 200 may not be exposed to the heat treatment due to the first capping film 700 and the second capping film 800. Accordingly, the property of the first field insulating film 200 can be kept uniform.

Figure 16:
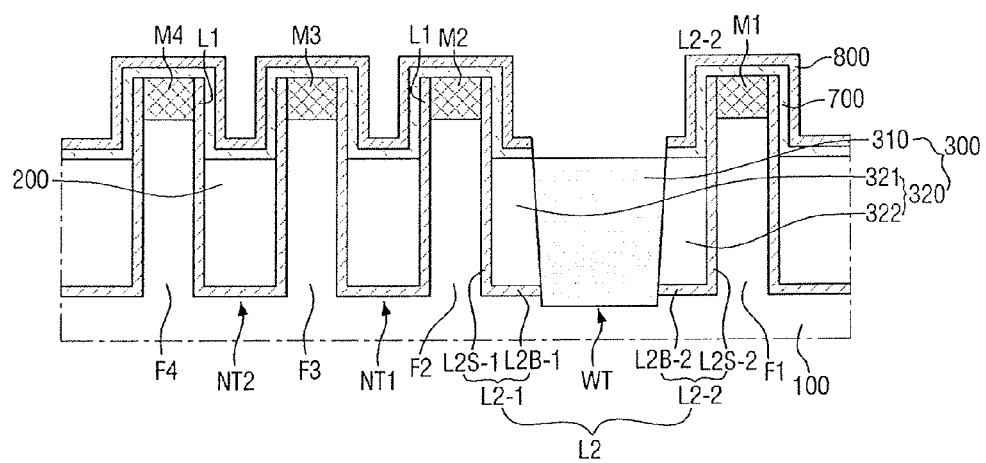

Next, referring to FIG. 16, a portion of the center insulating film 310 is removed.

At this time, the upper surface of the center insulating film 310 may be at the same level as the upper surface of the side insulating film 320. In other words, the upper surface of the center insulating film 310 may also be at the same level as the upper surface of the first field insulating film 200 of the first and the second narrow trenches NT1, NT2. In other words, the upper surface of the first field insulating film 200 of the first and the second narrow trenches NT1, NT2 and the upper surface of the second field insulating film 300 of the wide trench WT may be formed uniformly.

As a result, a semiconductor device fabricated with the semiconductor device fabricating method according to an exemplary embodiment of the present inventive concept can provide enhanced reliability.

Figure 17:
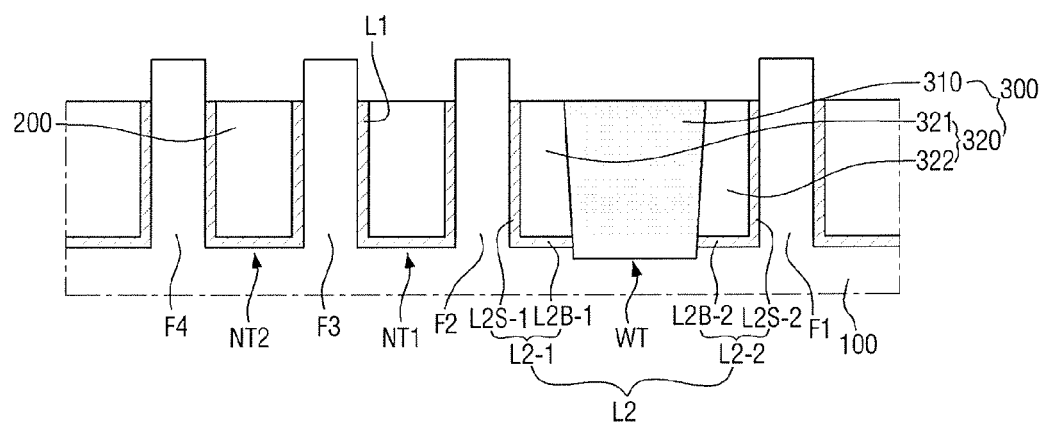

Next, referring to FIG. 17, the first capping film 700, the second capping film 800, the first to the fourth mask patterns M1-M4, a portion of the first liner L1, and a portion of the second liner L2 are removed.

The first capping film 700, the second capping film 800, and the first to the fourth mask patterns M1-M4 may be removed entirely. Further, the first liner L1 and the second liner L2 may be partially removed. For example, the first liner L1 and the second liner L2 may be partially etched such that the uppermost portion of the upper surface of the first liner L1 and the uppermost portion of the upper surface of the second liner L2 are coplanar with the first field insulating film 200 and the second field insulating film 300.

Accordingly, the upper portions of the first to the fourth fin-type patterns F1-F4 may be exposed. As described, since the upper portions of the first to the fourth fin-type patterns F1-F4 are exposed uniformly, a semiconductor device with high uniformity and reliability can be fabricated.

Next, referring to FIGS. 1 and 2, the gate insulating film 410 and the gate electrode 420 are formed on the first to the fourth fin-type patterns F1-F4.

The gate insulating film 410 and the gate electrode 420 may extend in a direction that intersects the first to the fourth fin-type patterns F1-F4. The gate insulating film 410 and the gate electrode 420 may be positioned on the first field insulating film 200 and the second field insulating film 300.

Hereinbelow, a fabricating method of a semiconductor device according to an exemplary embodiment will be explained with reference to FIGS. 5 to 15, 18 and 19. It is to be understood that elements or operations in FIGS. 18 and 19 are the same as or similar to those described above with reference to FIGS. 1 to 17 and thus will be mentioned briefly or omitted for the sake of brevity.

Figure 18:
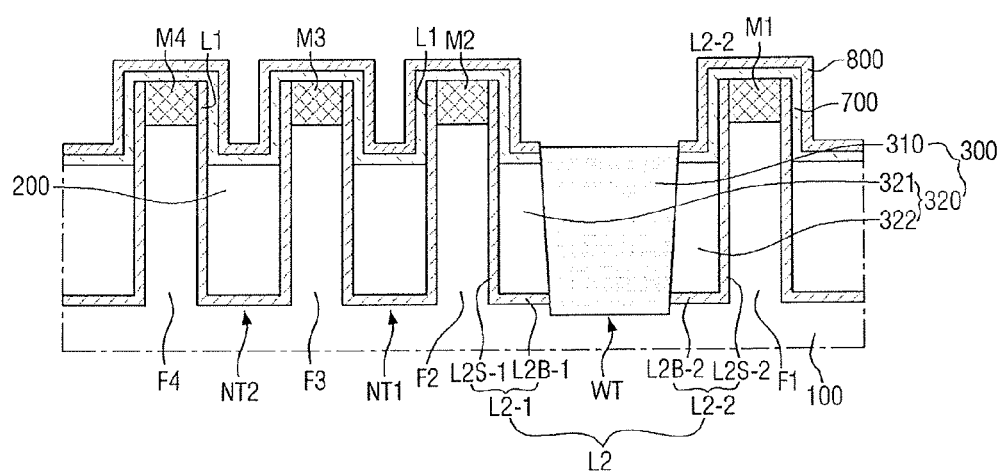
FIGS. 18 and 19 are views illustrating stages of fabrication, provided to explain a fabricating method of a semiconductor device according to an exemplary embodiment of the present inventive concept.
Figure 19:
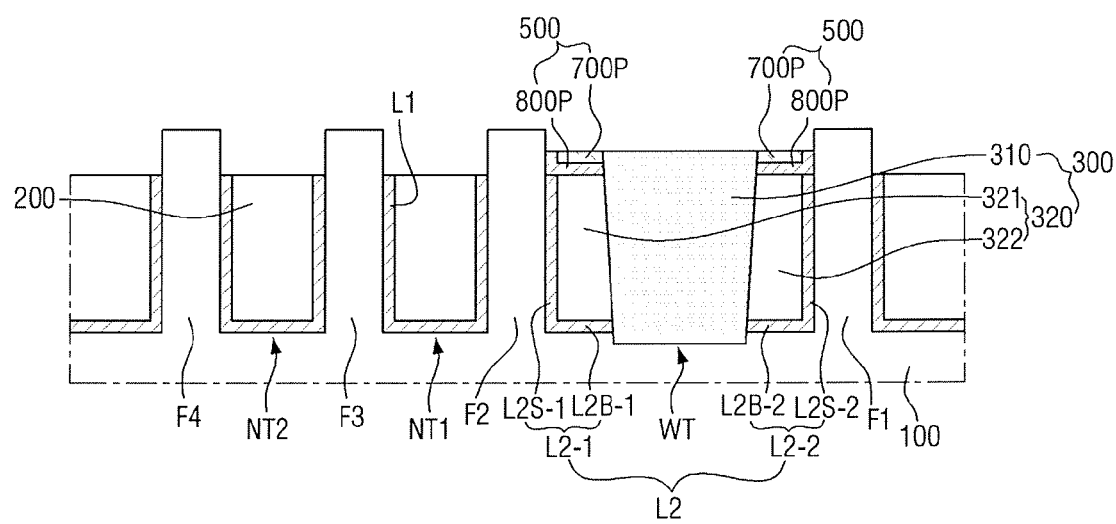

FIGS. 18 and 19 are views illustrating stages of fabrication, provided to explain a fabricating method of a semiconductor device according to an exemplary embodiment of the present inventive concept.

An exemplary embodiment of the present inventive concept will be described below with reference to FIG. 18, starting from the embodiment of FIG. 15.

Referring to FIG. 18, a portion of the center insulating film 310 is removed.

At this time, the upper surface of the center insulating film 310 may be formed higher than the upper surface of the side insulating film 320. In other words, the upper surface of the center insulating film 310 may be higher than the upper surface of the first field insulating film 200 of the first and the second narrow trenches NT1, NT2. The side surface of the center insulating film 310 may be in contact with the first capping film 700 and the second capping film 800. According to exemplary embodiments of the present inventive concept, the side surface of the center insulating film 310 may be in contact with the first capping film 700 and may not be in contact with the second capping film 800. In other words, whether or not the second capping film 800 is in contact with the center insulating film 310 is not particularly limited, as long as the upper surface of the center insulating film 310 is higher than the upper surface of the side insulating film 320.

Next, referring to FIG. 19, the first capping film 700, the second capping film 800, the first to the fourth mask patterns M1-M4, and a portion of the first liner L1 are removed.

The first to the fourth mask patterns M1-M4 may be removed entirely. Further, a portion of the first liner L1 may be removed. For example, the first liner L1 may be partially etched such that the uppermost portion of the upper surface of the first liner L1 is coplanar with the first field insulating film 200.

A portion of the second liner L2 may be removed. For example, because the height of the upper surface of the second liner L2 is lower than the center insulating film 310, this portion of the second liner L2 may remain. The first capping film 700 and the second capping film 800 may form a capping film 500. In other words, the first capping film 700 and the second capping film 800 may partially remain on the side insulating film 320 (see 700P and 800P), while the rest of the first capping film 700 and the second capping film 800 are removed. The thickness of the stack of the capping film 500 may be same as the height difference between the center insulating film 310 and the side insulating film 320.

According to exemplary embodiments of the present inventive concept, the capping film 500 may include the first capping film 700, but may not include the second capping film 800. In other words, the constitution of the capping film 500 may be varied depending on the height of the center insulating film 310.

Next, referring to FIG. 5, the gate insulating film 410 and the gate electrode 420 are formed on the first to the fourth fin-type patterns F1-F4.

The gate insulating film 410 and the gate electrode 420 may extend in a direction that intersects the first to the fourth fin-type patterns F1-F4. The gate insulating film 410 and the gate electrode 420 may be positioned on the first field insulating film 200, the second field insulating film 300, and the capping film 500.

Hereinbelow, a fabricating method of a semiconductor device according to an exemplary embodiment of the present inventive concept will be explained with reference to FIGS. 1, 2, 6 to 8, 11 to 17, 20 and 21. It is to be understood that elements or operations in FIGS. 20 and 21 that are the same as those described above with reference to FIGS. 1 to 19 will be mentioned briefly or omitted.

Figure 20:
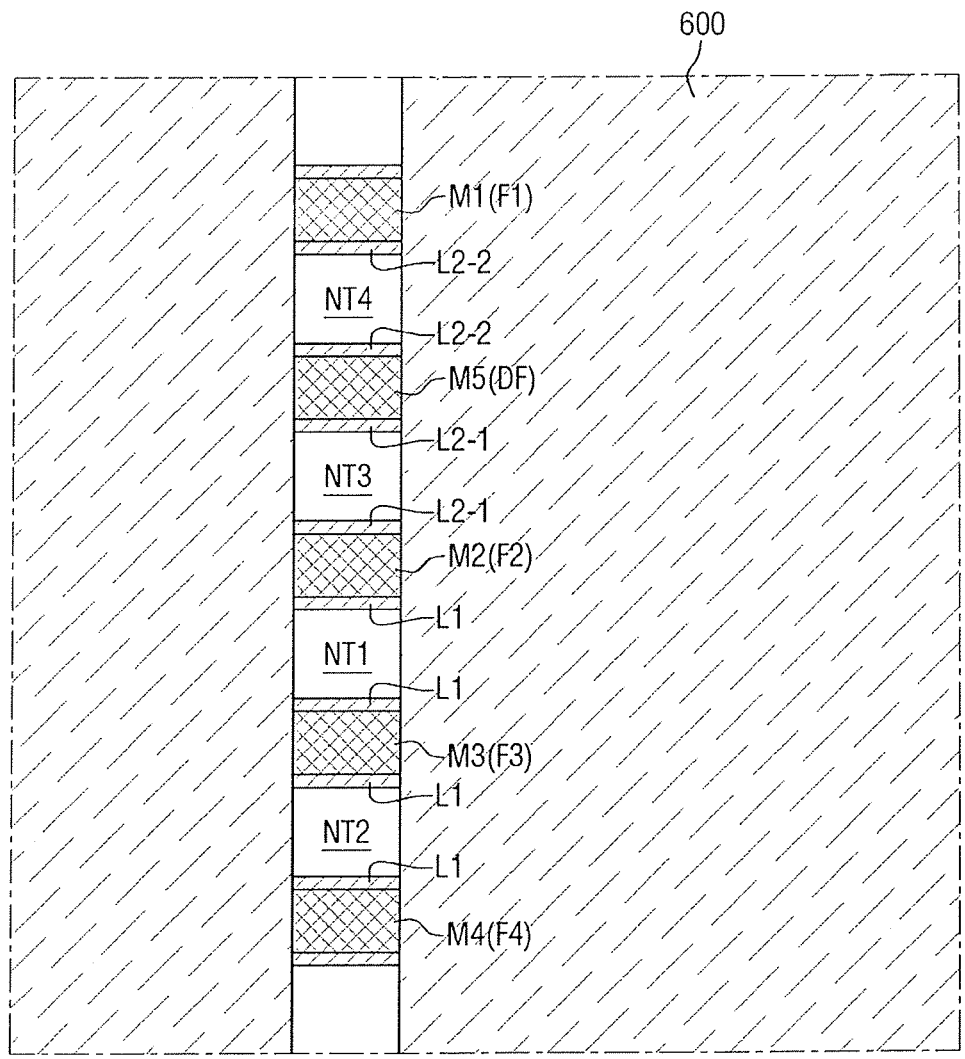
FIGS. 20 and 21 are views illustrating stages of fabrication, provided to explain a fabricating method of a semiconductor device according to an exemplary embodiment of the present inventive concept.
Figure 21:
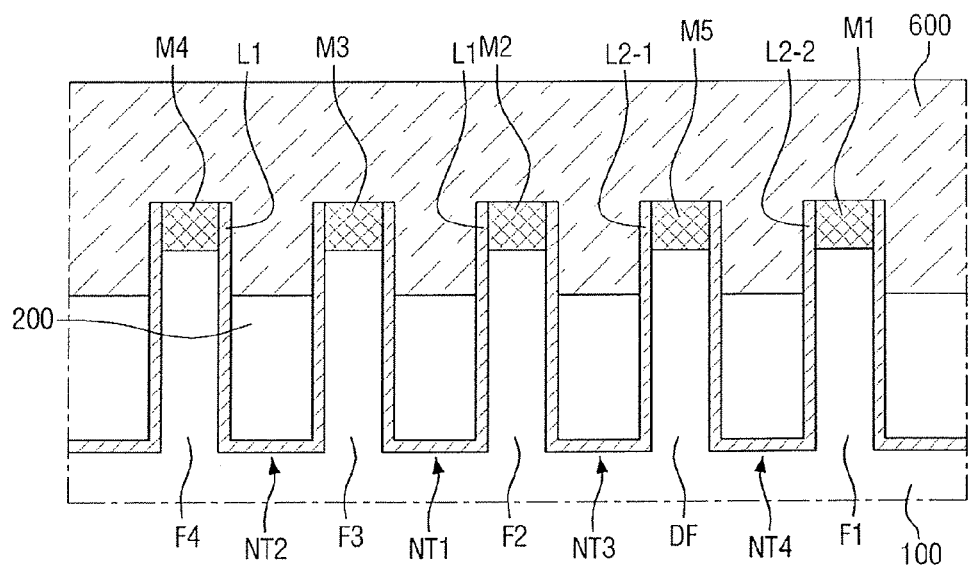

FIGS. 20 and 21 are views illustrating stages of fabrication, provided to explain a fabricating method of a semiconductor device according to an exemplary embodiment of the present inventive concept.

An exemplary embodiment of the present inventive concept will be described below with reference to FIGS. 20 and 21, starting from the embodiment of FIG. 8.

Next, referring to FIGS. 20 and 21, the barrier film 600 may be formed on the first liner L1, the second liner L2, and the first to the fifth mask patterns M1-M5.

In other words, unlike the exemplary embodiments described above, the first capping film 700 may be omitted, and the barrier film 600 may be directly formed. The barrier film 600 may partially cover the upper surface of the first capping film 700, while exposing the rest of the upper surface of the first capping film 700. The barrier film 600 may expose the first capping film 700 in a direction that intersects the direction in which the first to the fourth fin-type patterns F1-F4 and the dummy fin-type pattern DF extend.

As a result, the first to the fourth fin-type patterns F1-F4 and the dummy fin-type pattern DF may be separated into three regions, respectively. For example, the first to the fourth fin-type patterns F1-F4 and the dummy fin-type pattern DF may include first to third regions, respectively. Only the first and the third regions may be covered by the barrier film 600, while the second region is exposed. In other words, among the first to the fourth fin-type patterns F1-F4 and the dummy fin-type pattern DF, the portions covered by the barrier film 600 on the left-hand side of FIG. 20 may be the third region, and the portions covered by the barrier film 600 on the right-hand side of FIG. 20 may be the first region. The portions of the first to the fourth fin-type patterns F1-F4 and the dummy fin-type pattern DF exposed in FIG. 20 may be the second region.

The same processes as in the exemplary embodiments described above with reference to FIGS. 11 to 17, and 1 and 2 may then be carried out, except for the step of forming the first capping film 700.

Hereinbelow, a fabricating method of a semiconductor device according to an exemplary embodiment of the present inventive concept will be explained with reference to FIGS. 1, 2, 6 to 8, and 22 to 34. It is to be understood that elements or operations in FIGS. 22 to 34 are the same as or similar to those described above with reference to FIGS. 1 to 21 and thus will be mentioned briefly or omitted for the sake of brevity.

Figure 28:
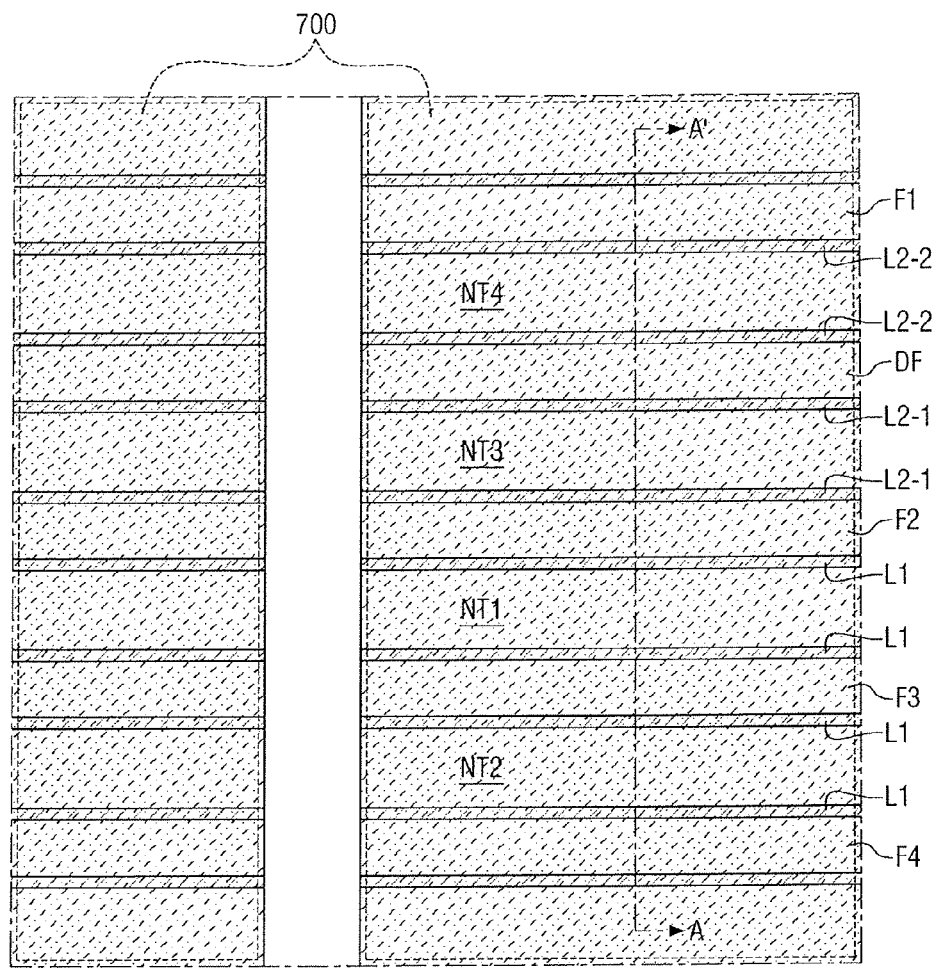
Figure 29:
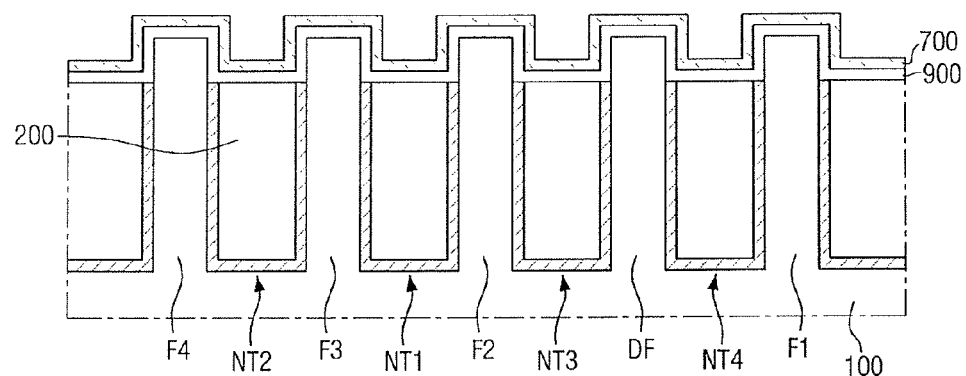

FIGS. 22 to 34 are views illustrating stages of fabrication, provided to explain a fabricating method of a semiconductor device according to an exemplary embodiment of the present inventive concept. FIG. 23 is a cross sectional view taken along line A-A' of FIG. 22, FIG. 29 is a cross sectional view taken along line A-A' of FIG. 28, and FIG. 31 is a cross sectional view taken along line A-A' of FIG. 30.

An exemplary embodiment of the present inventive concept will be described below with reference to FIGS. 22 and 23, starting from the embodiment of FIG. 8.

Figure 22:
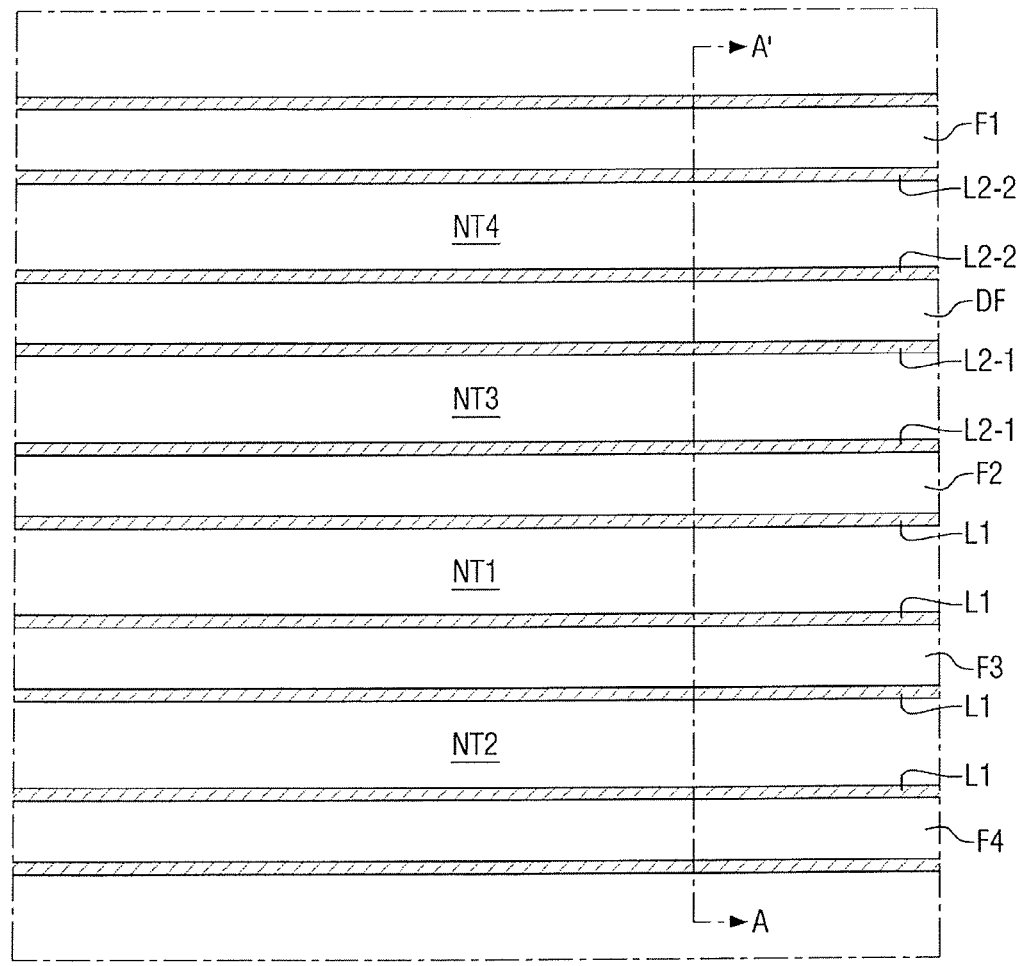
FIGS. 22, 23, 24, 25, 26, 27, 28, 29, 30, 31, 32, 33 and 34 are views illustrating stages of fabrication, provided to explain a fabricating method of a semiconductor device according to an exemplary embodiment of the present inventive concept.
Figure 23:
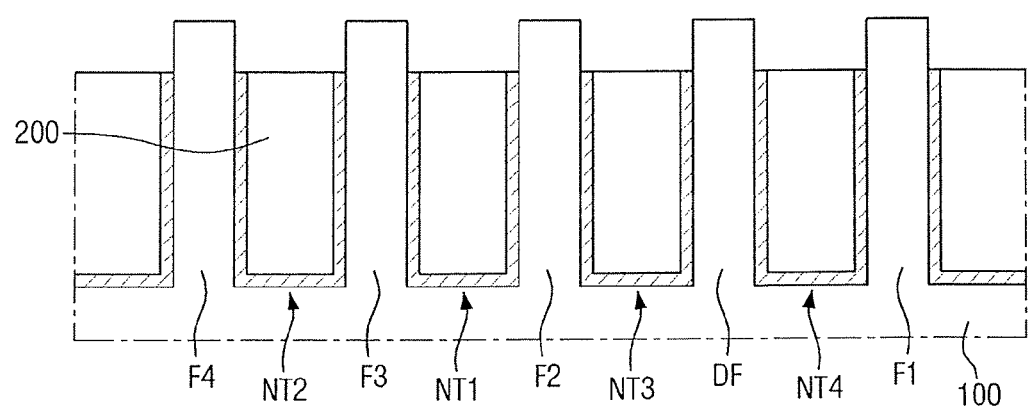

Referring to FIGS. 22 and 23, the first to the fourth mask patterns M1-M4, a portion of the first liner L1 and a portion of the second liner L2 are removed.

The first liner L1 and the second liner L2 may be partially removed. For example, the first liner L1 and the second liner L2 may be partially etched such that the uppermost portion of the upper surface of the first liner L1 and the uppermost portion of the upper surface of the second liner L2 are coplanar with the first field insulating film 200.

Accordingly, the upper portions of the first to the fourth fin-type patterns F1-F4 may be exposed.

Figure 24:
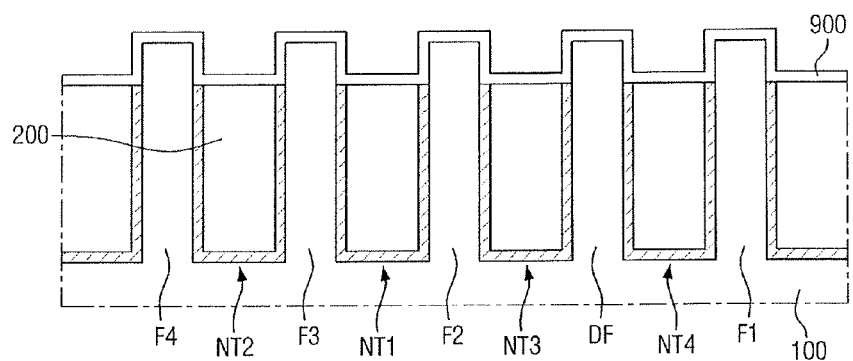

Next, referring to FIG. 24, a third capping film 900 may be formed on the first liner L1, the second liner L2, the first to the fourth fin-type patterns F1-F4, and the dummy fin-type pattern DF.

The third capping film 900 may be formed conformally along the surfaces of the first liner L1, the second liner L2, the first to the fourth fin-type patterns F1-F4, and the dummy fin-type pattern DF. The third capping film 900 may be an insulating material which may be a different material from that of the first liner L1 or the second liner L2. However, exemplary embodiments of the present inventive concept are not limited to the example given above. For example, the third capping film 900 may include silicon oxide.

Figure 25:
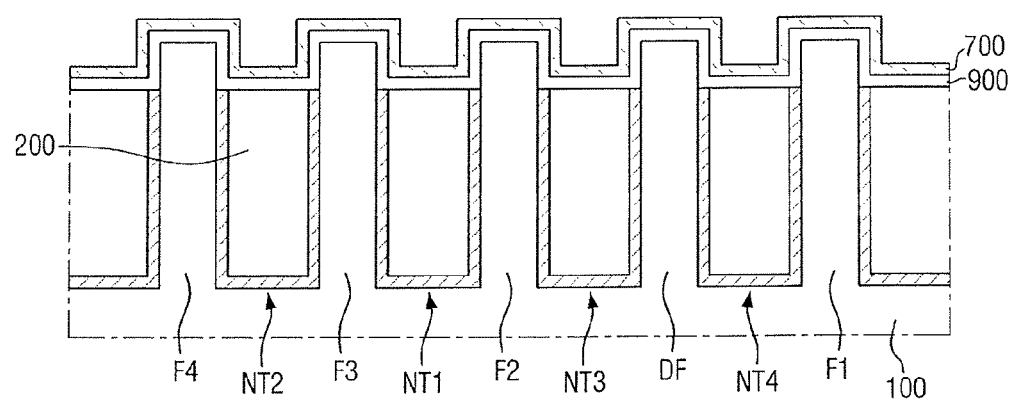

Next, referring to FIG. 25, the first capping film 700 is formed on the third capping film 900.

The first capping film 700 may be conformally formed on the third capping film 900. The first capping film 700 may be an insulating material which may be the same material as that of the first liner L1 or the second liner L2. However, exemplary embodiments of the present inventive concept are not limited to the example given above. For example, the first capping film 700 may include silicon nitride.

Figure 26:
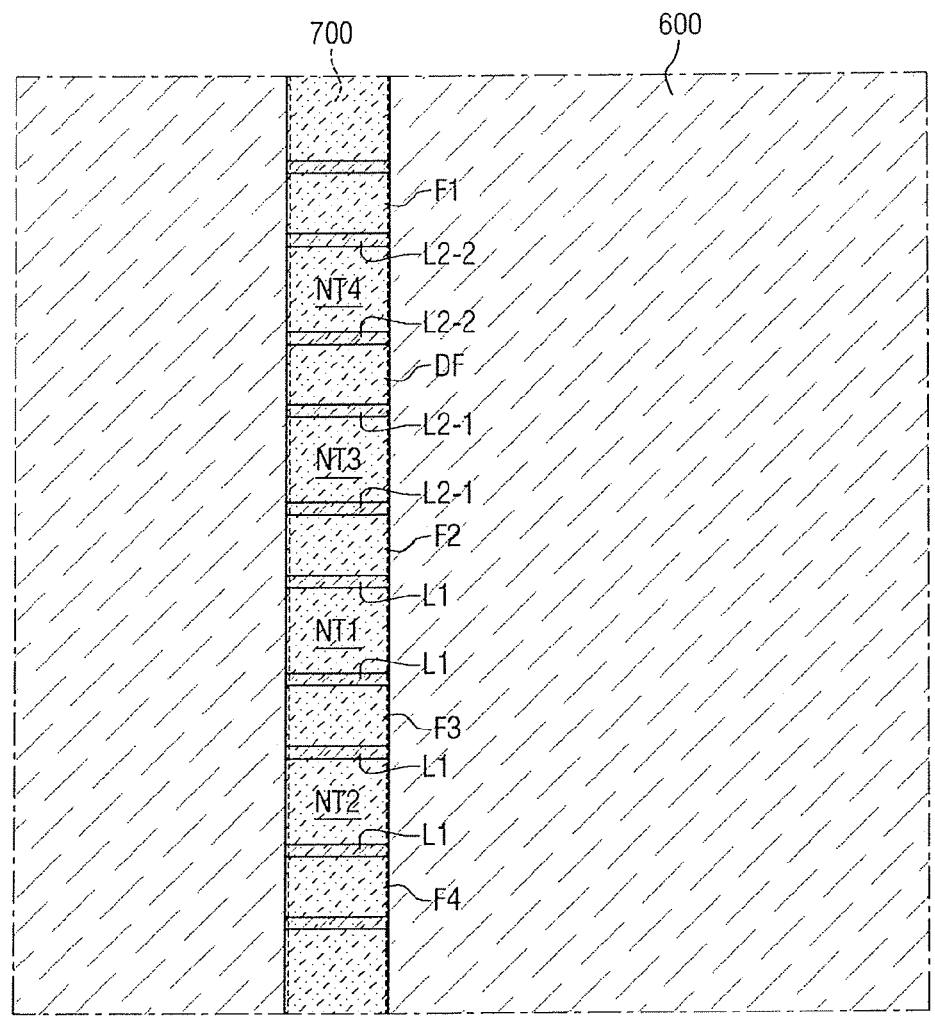
Figure 27:
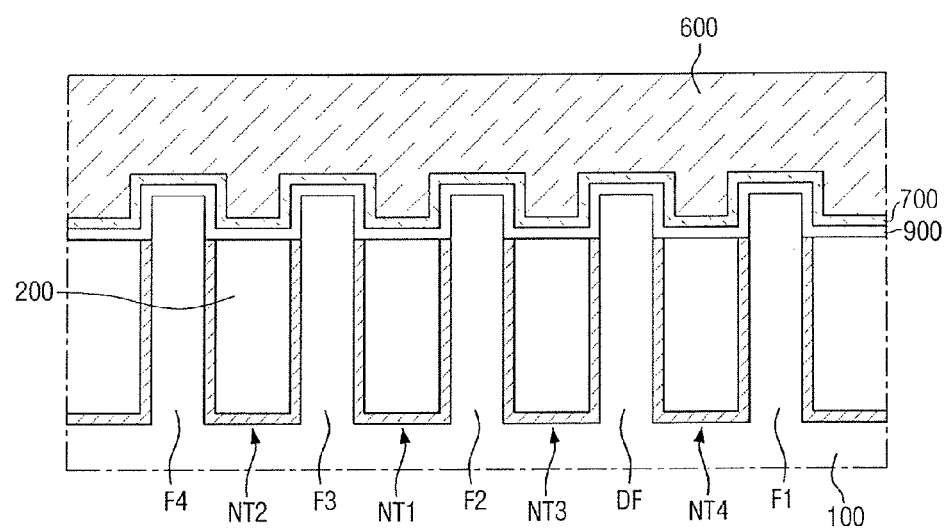

Next, referring to FIGS. 26 and 27, the barrier film 600 may be formed on the first capping film 700. The barrier film 600 may partially cover the upper surface of the first capping film 700, while exposing the rest of the upper surface of the first capping film 700. Referring to FIG. 26, the barrier film 600 may expose the first capping film 700 in a direction that intersects the direction in which the first to the fourth fin-type patterns F1-F4 and the dummy fin-type pattern DF extend.

As a result, the first to the fourth fin-type patterns F1-F4 and the dummy fin-type pattern DF may be separated into three regions, respectively. For example, the first to the fourth fin-type patterns F1-F4 and the dummy fin-type pattern DF may include first to third regions, respectively. Only the first and the third regions may be covered by the barrier film 600, while the second region is exposed. In other words, among the first to the fourth fin-type patterns F1-F4 and the dummy fin-type pattern DF, the portions covered by the barrier film 600 on the left-hand side of FIG. 26 may be the third region, and the portions covered by the barrier film 600 on the right-hand side of FIG. 26 may be the first region. The portions of the first to the fourth fin-type patterns F1-F4 and the dummy fin-type pattern DF exposed in FIG. 26 may be the second region.

The barrier film 600 may include at least one of a photo-resist (PR) and an amorphous carbon layer (ACL). However, exemplary embodiments of the present inventive concept are not limited to the example given above. When the barrier film 600 is a photo-resist, the second region may be removed by a photolithography process.

Next, referring to FIGS. 28 and 29, the second region may be removed. The portion of the first field insulating film 200 that is not overlapped with the barrier film 600 may also be removed, in addition to the second region of the first to the fourth fin-type patterns F1-F4 and the dummy fin-type pattern DF.

The barrier film 600 may then be removed. The removal of the barrier film 600 causes the entire upper surface of the first capping film 700 to be exposed.

Figure 30:
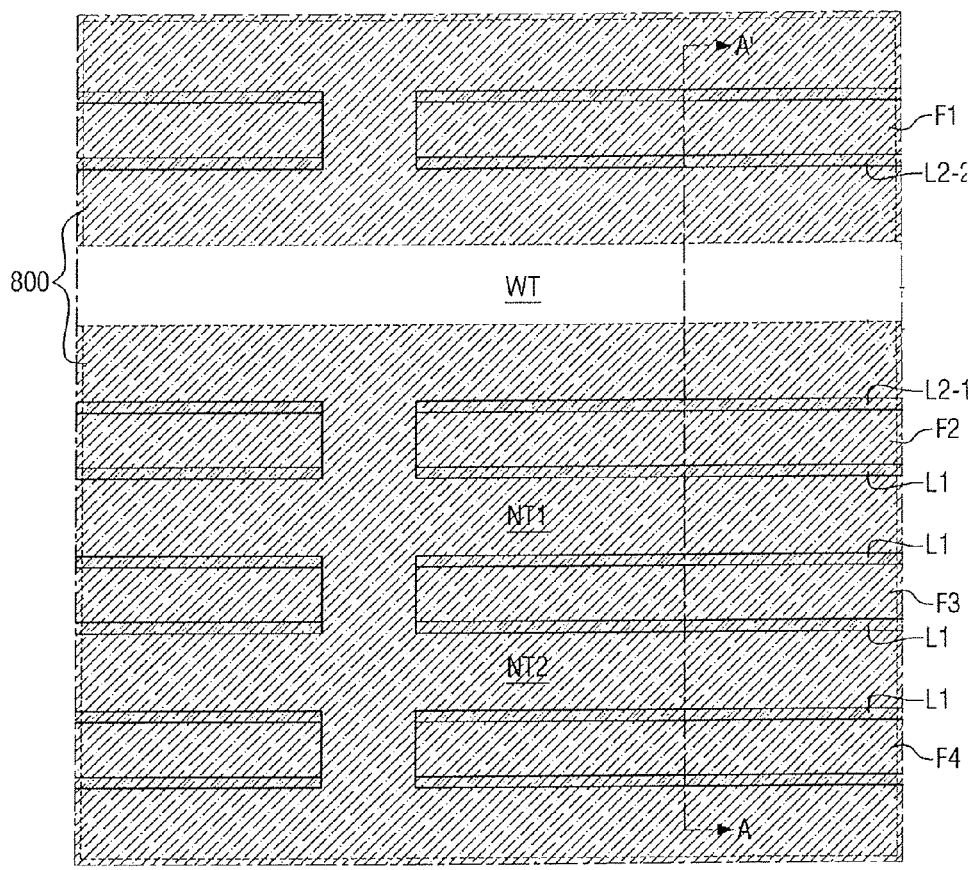
Figure 31:
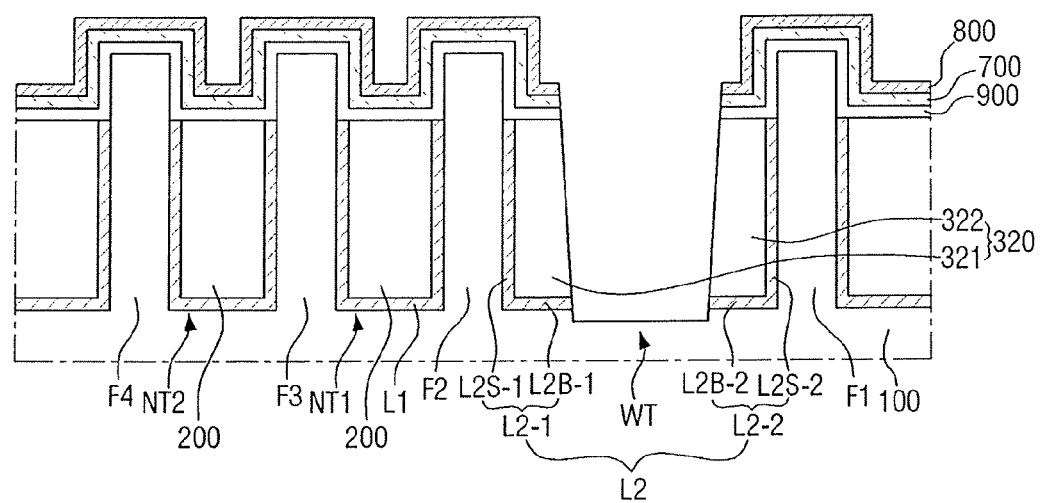

Next, referring to FIGS. 30 and 31, the second capping film 800 is formed on the first capping film 700.

The second capping film 800 may be conformally formed on the first capping film 700. The second capping film 800 may be an insulating material which may be the same material as that of the first liner L1, the second liner L2, or the first capping film 700. However, exemplary embodiments of the present inventive concept are not limited to the example given above. For example, the second capping film 800 may include silicon nitride.

The dummy fin-type pattern DF is then removed.

Concurrently with the removal of the dummy fin-type pattern DF, a portion of the first field insulating film 200 in the third narrow trench NT3 and the fourth narrow trench NT4 may be removed. The trench, which is formed with the removal of the dummy fin-type pattern DF, may include a bottom surface which is deeper than the first to the fourth narrow trenches NT1-NT4. Combined with the portion of the third narrow trench NT3 and the fourth narrow trench NT4, the trench that is newly formed as described above may form a wide trench WT. A portion of the wide trench WT may be filled with the first field insulating film 200, the second liner L2, or the like.

Concurrently with the removal of the dummy fin-type pattern DF, a portion of the first capping film 700, the second capping film 800 and the third capping film 900, either overlapped with, or adjacent to the dummy fin-type pattern DF, may also be removed.

At this time, the second liner L2 may be divided into a first side liner L2-1 and a second side liner L2-2. The first field insulating film 200 within the third narrow trench NT3 may be formed into a first side insulating film 321 of the second field insulating film 300. The first field insulating film 200 within the fourth narrow trench NT4 may be formed into a second side insulating film 322 of the second field insulating film 300.

Figure 32:
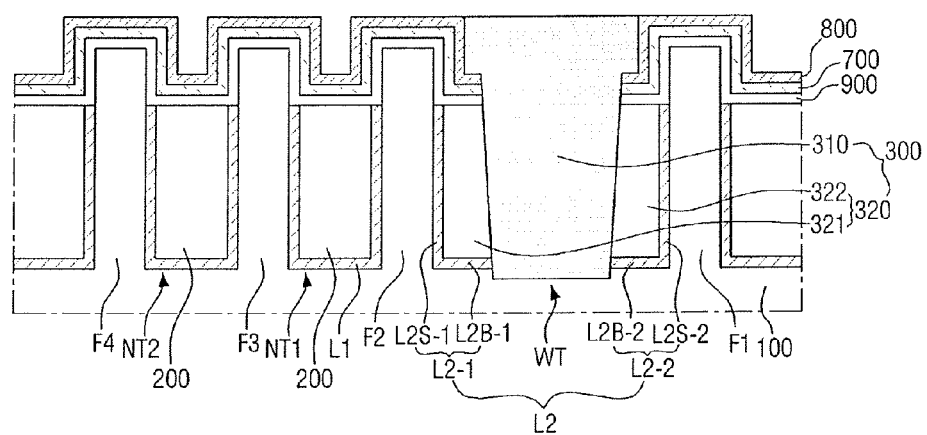

Next, referring to FIG. 32, the wide trench WT is filled.

The wide trench WT may be filled with the second field insulating film 300. The second field insulating film 300 may include the side insulating film 320 and the center insulating film 310. At this time, the side insulating film 320 may be a portion of the first field insulating film 200 which is formed previously. The center insulating film 310 may be newly filled. The center insulating film 310 may entirely fill the wide trench WT.

At this time, the material of the center insulating film 310 may be same as the material of the first field insulating film 200. However, exemplary embodiments of the preset inventive concept are not limited to the example given above.

The center insulating film 310 may be subject to heat treatment after filling the wide trench WT. Through the heat treatment, the second field insulating film 300 may be cured and may acquire stress properties. At this time, the first field insulating film 200 may not be exposed to the heat treatment due to the first capping film 700, the second capping film 800, and the third capping film 900. Accordingly, the property of the first field insulating film 200 can be kept uniform.

Figure 33:
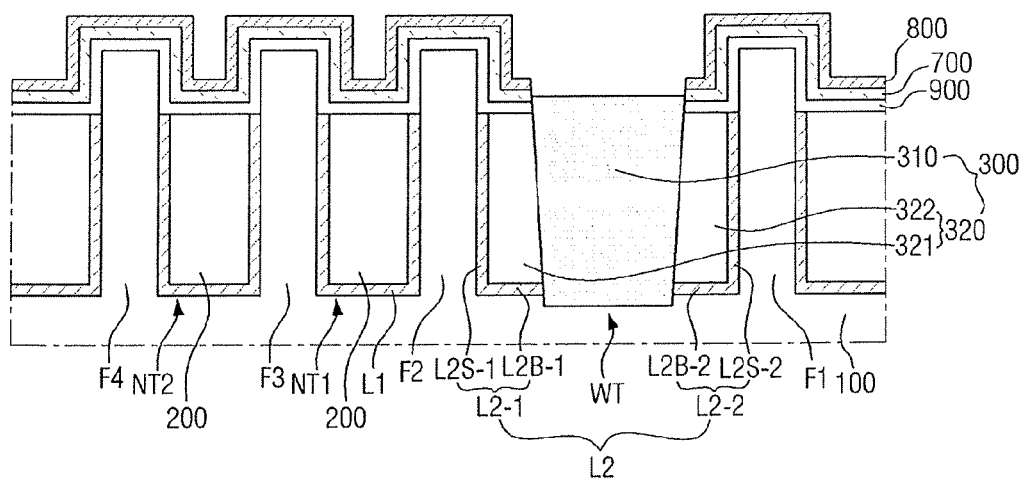

Next, referring to FIG. 33, a portion of the center insulating film 310 is removed.

At this time, the upper surface of the center insulating film 310 may be formed higher than the upper surface of the side insulating film 320. In other words, the upper surface of the center insulating film 310 may be higher than the upper surface of the first field insulating film 200 of the first and the second narrow trenches NT1, NT2. The side surface of the center insulating film 310 may be in contact with the third capping film 900 and the first capping film 700. According to exemplary embodiments of the present inventive concept, the side surface of the center insulating film 310 may be in contact with the third capping film 900 and may not be in contact with the first capping film 700. According to exemplary embodiments of the present inventive concept, the side surface of the center insulating film 310 may be in contact with all of the third capping film 900, the first capping film 700 and the second capping film 800. Whether or not the first capping film 700 and the second capping film 800 are in contact with the center insulating film 310 is not particularly limited, as long as the upper surface of the center insulating film 310 is higher than the upper surface of the side insulating film 320.

Figure 34:
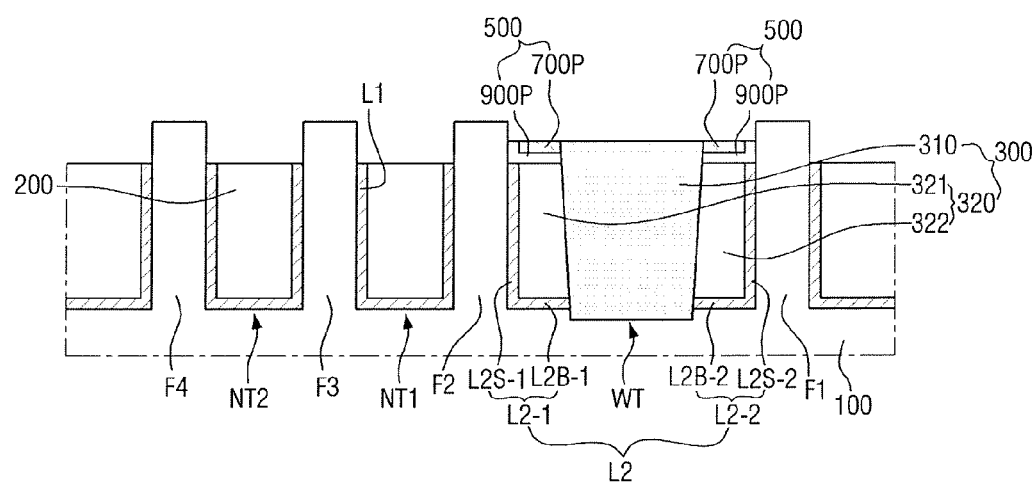

Next, referring to FIG. 34, the first capping film 700, the second capping film 800, the third capping film 900, and a portion of the first liner L1 are removed.

The first liner L1 may be removed partially. For example, the first liner L1 may be partially etched such that the uppermost portion of the upper surface of the first liner L1 is coplanar with the first field insulating film 200.

A portion of the second liner L2 may be removed. For example, because the height of the upper surface of the second liner L2 is lower than the center insulating film 310, this portion of the second liner L2 may remain. The third capping film 900 and the first capping film 700 may form the capping film 500. In other words, the third capping film 900 and the first capping film 700 may partially remain on the side insulating film 320 (see 700P and (900P), while the rest of the third capping film 900 and the first capping film 700 are removed. The thickness of the stack of the capping film 500 may be same as the height difference between the center insulating film 310 and the side insulating film 320.

According to exemplary embodiments of the present inventive concept, the capping film 500 may include the third capping film 900, but may not include the first capping film 700. According to an exemplary embodiment of the present inventive concept, the capping film 500 may include all of the first capping film 700, the second capping film 800 and the third capping film 900. In other words, the constitution of the capping film 500 may be varied depending on the height of the center insulating film 310.

Figure 35:
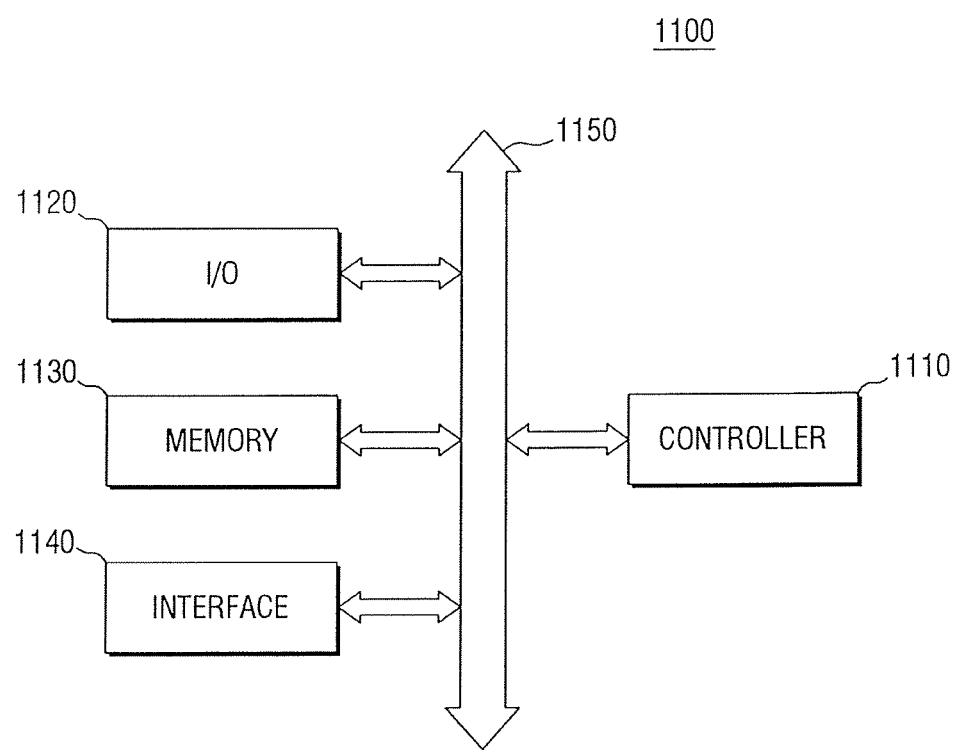
FIG. 35 is a block diagram of an electronic system comprising a semiconductor device according to an exemplary embodiment of the present inventive concept.

FIG. 35 is a block diagram of an electronic system comprising a semiconductor device according to an exemplary embodiment of the present inventive concept.

Referring to FIG. 35, the electronic system 1100 according to an exemplary embodiment of the present inventive concept may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, a digital signal processor, a micro controller and logic devices capable of performing functions similar to those devices just mentioned. The I/O device 1120 may include a keypad, a keyboard, a display device and so on. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

The electronic system 1100 may additionally include an operation memory configured to enhance operation of the controller 1110, such as a high-speed dynamic random-access memory (DRAM) and/or a static random access memory (SRAM).

The semiconductor device according to the exemplary embodiments of the present inventive concept described above, may be provided within the memory device 1130, or provided as a part of the controller 1110, the I/O device 1120, and so on.

The electronic system 1100 is applicable to a personal digital assistant (PDA), a portable computer, a web tablet, a wireless phone, a mobile phone, a digital music player, a memory card, or any electronic product capable of transmitting and/or receiving data in wireless environment.

Figure 36:
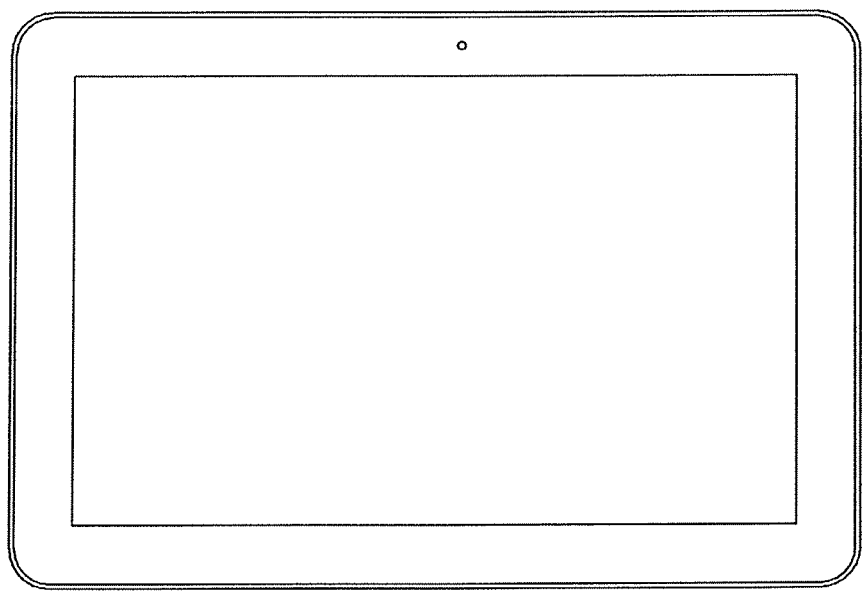
FIGS. 36, 37 and 38 illustrate exemplary semiconductor systems which may apply therein a semiconductor device according to an exemplary embodiment of the present inventive concept.
Figure 37:
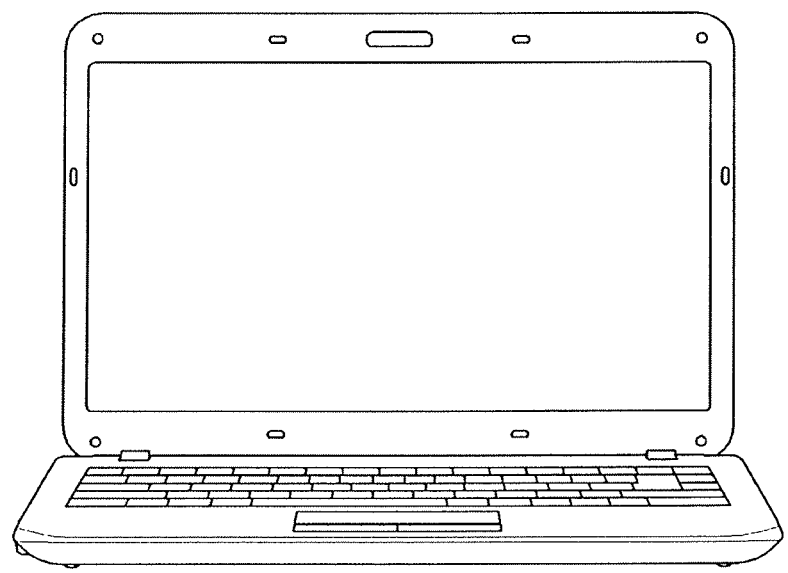
Figure 38:
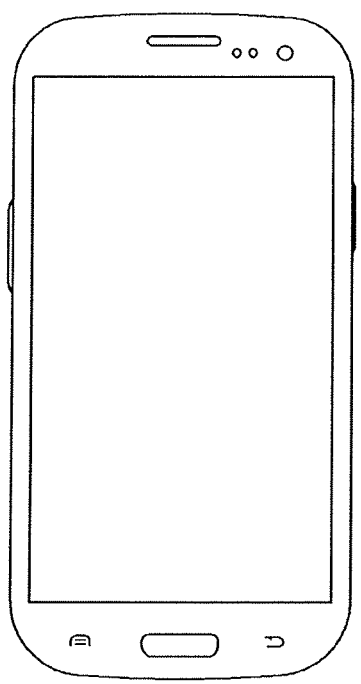

FIGS. 36 to 38 each illustrate an exemplary semiconductor system which may apply therein a semiconductor device according to an exemplary embodiment of the inventive concept.

FIG. 36 illustrates a tablet personal computer (PC) 1200, FIG. 37 illustrates a laptop computer 1300, and FIG. 38 illustrates a smartphone 1400. The semiconductor device according to the exemplary embodiments of the present inventive concept explained above, may be used in these devices, e.g., the inventive semiconductor device may be used in the tablet PC 1200, the laptop computer 1300 or the smartphone 1400.

It is to be understood that the semiconductor device according to exemplary embodiments described above is applicable to other integrated circuit devices.

In other words, while only the tablet PC 1200, the laptop computer 1300 and the smartphone 1400 are exemplified herein as semiconductor systems to which the semiconductor device according to the exemplary embodiments of the present inventive concept may be applied, the application of the inventive semiconductor device is not limited to these examples.

In exemplary embodiments of the present inventive concept, the semiconductor system may be realized as a computer, an ultra mobile PC (UMPC), a workstation, a net-book, a personal digital assistant (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, a digital video player, and so on.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
   a fin-type pattern protruding from a substrate and comprising a first side surface and a second side surface opposite each other;
   a first trench in contact with the first side surface;
   a second trench in contact with the second side surface;
   a first liner formed conformally on a side surface and a bottom surface of the first trench;
   a first field insulating film disposed on the first liner and partially filling the first trench;
   a second liner formed conformally on a side surface of the second trench and exposing a bottom surface of the second trench; and
   a second field insulating film disposed on the second liner and partially filling the second trench,
   wherein a portion of the second liner is disposed beneath a bottom portion of the second field insulating film.

2. The semiconductor device of claim 1, wherein a width of the first trench is smaller than a width of the second trench.

3. The semiconductor device of claim 1, wherein a depth of the first trench is smaller than a depth of the second trench.

4. The semiconductor device of claim 1, wherein an upper surface of the second field insulating film is higher than, or coincident with an upper surface of the first field insulating film.

5. The semiconductor device of claim 4, further comprising a gate electrode formed on the fin-type pattern and the first and the second field insulating films.

6. The semiconductor device of claim 5, wherein the gate electrode comprises a first portion and a second portion,
   the first portion is overlapped with the first field insulating film,
   the second portion is overlapped with the second field insulating film, and
   a thickness of the second portion is greater than that of the first portion.

7. The semiconductor device of claim 4, wherein the second liner comprises a side region formed conformally on the side surface of the second trench, and a bottom region connected with the side region and formed conformally along a portion of the bottom surface of the second trench,
   the second field insulating film comprises a first region in contact with the side region, and a second region in contact with the first region and spaced apart from the side region by the first region, and
   a height of an upper surface of the first region is lower than a height of an upper surface of the second region.

8. The semiconductor device of claim 7, wherein the height of the upper surface of the first region is the same as the height of the upper surface of the first field insulating film.

9. The semiconductor device of claim 1, wherein the second liner comprises a side region formed conformally on the side surface of the second trench, and a bottom region connected with the side region and formed conformally along a portion of the bottom surface of the second trench.

10. The semiconductor of claim 9, wherein the second field insulating film comprises a first region in contact with the side region, and a second region in contact with the first region and spaced apart from the side region by the first region.

11. The semiconductor device of claim 10, wherein an etch rate of the first region is different from an etch rate of the second region.

12. The semiconductor device of claim 10, wherein the first region and the second region comprise different materials from each other.

13. The semiconductor device of claim 10, wherein the first region is spaced apart from the substrate, and the second region is in direct contact with the substrate.

14. The semiconductor device of claim 10, wherein a bottom surface of the first region is higher than a bottom surface of the second region.

15. The semiconductor device of claim 9, wherein a height of an upper surface of the side region is the same as a height of an upper surface of the second field insulating film.

16. The semiconductor device of claim 1, wherein a height of an uppermost portion of the first liner is the same as a height of an uppermost portion of the second liner.

17. The semiconductor device of claim 16, wherein the height of the uppermost portion of the first liner is the same as a height of an uppermost portion of the first field insulating film.

18. A semiconductor device, comprising:
 a first fin-type pattern and a second fin-type pattern;
 a first trench formed between the first fin-type pattern and the second fin-type pattern;
 a first liner in contact with the first fin-type pattern and formed conformally on a sidewall and a bottom surface of the first trench;
 a second liner in contact with the second fin-type pattern, spaced apart from the first liner, and formed conformally on the sidewall and the bottom surface of the first trench; and
 a first field insulating film filling the first trench, wherein the first field insulating film comprises a first insulating film formed on the first liner, a second insulating film formed on the second liner, and a third insulating film formed between the first insulating film and the second insulating film and directly contacting a substrate.

19. The semiconductor device of claim 18, wherein an upper surface of the third insulating film is higher than upper surfaces of the first insulating film and the second insulating film.

20. A semiconductor device, comprising:
 first, second, and third fin-type patterns protruding from a substrate;
 a first trench formed between the first fin-type pattern and the second fin-type pattern;
 a second trench formed between the second fin-type pattern and the third fin-type pattern and having a wider width than the first trench;
 a first liner formed along a bottom surface and first and second side surfaces of the first trench;
 a second liner formed along a bottom surface and a side surface of the second trench and exposing the bottom surface of the second trench;
 a first field insulating film disposed on the first liner and partially filling the first trench; and
 a second field insulating film disposed on the second liner and partially filling the second trench,
 wherein a portion of the second liner is disposed beneath a bottom portion of the second field insulation film.

* * * * *